United States Patent
Mukai et al.

(10) Patent No.: US 7,941,767 B2
(45) Date of Patent: May 10, 2011

(54) PHOTOMASK MANAGEMENT METHOD AND PHOTOMASK WASH LIMIT GENERATING METHOD

(75) Inventors: Hidefumi Mukai, Kawasaki (JP); Shinji Yamaguchi, Tokyo (JP); Yukiyasu Arisawa, Tsukuba (JP); Toshiya Kotani, Machida (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 460 days.

(21) Appl. No.: 12/112,688

(22) Filed: Apr. 30, 2008

(65) Prior Publication Data

US 2008/0320434 A1     Dec. 25, 2008

(30) Foreign Application Priority Data

May 1, 2007    (JP) ................. 2007-121027

(51) Int. Cl.
  *G06F 17/50*   (2006.01)
  *G06F 19/00*   (2006.01)
  *G01B 7/00*    (2006.01)
  *G06K 9/00*    (2006.01)

(52) U.S. Cl. .............. 716/50; 716/54; 716/55; 702/155; 382/144; 700/121

(58) Field of Classification Search ............... 716/19, 716/50, 54, 55; 430/5; 702/155; 382/144; 700/121
See application file for complete search history.

(56) References Cited

U.S. PATENT DOCUMENTS

| | | | |
|---|---|---|---|
| 6,709,791 B1 * | 3/2004 | Mohri et al. ............... 430/5 |
| 7,090,949 B2 | 8/2006 | Nojima et al. | |
| 7,181,707 B2 | 2/2007 | Kotani et al. | |
| 7,732,108 B2 * | 6/2010 | Park ............................. 430/30 |
| 2005/0112474 A1 * | 5/2005 | Sandstrom ................. 430/5 |
| 2005/0233225 A1 * | 10/2005 | Ibaragi ........................ 430/5 |
| 2007/0182941 A1 | 8/2007 | Arisawa et al. | |

FOREIGN PATENT DOCUMENTS

| | | |
|---|---|---|
| JP | 2001-56544 | 2/2001 |
| JP | 3425414 | 5/2003 |
| JP | 2004-30579 | 1/2004 |
| JP | 2004-40038 | 2/2004 |
| JP | 2004-184633 | 7/2004 |
| JP | 2007-78712 | 3/2007 |
| JP | 2007-110154 | 4/2007 |
| JP | 2007-187998 | 7/2007 |

OTHER PUBLICATIONS

Machine Translated English Translation of Japanese Patent No. JP 3425414.*
Machine Translated English Translation of Japanese Application No. 2007-78712.*
Notification of Reasons for Rejection issued by the Japanese Patent Office on Aug. 11, 2009, for Japanese Patent Application No. 2007-121027, and English-language translation thereof.

* cited by examiner

*Primary Examiner* — Stacy A Whitmore
*Assistant Examiner* — Magid Y Dimyan
(74) *Attorney, Agent, or Firm* — Finnegan, Henderson, Farabow, Garrett & Dunner, L.L.P.

(57) ABSTRACT

A photomask is washed and at least one physical amount of transmittance and phase difference of the photomask, dimension of a pattern, height of the pattern and a sidewall shape of the pattern is measured. After this, the two-dimensional shape of a borderline pattern previously determined for the photomask is measured. Lithography tolerance is derived by performing a lithography simulation for the measured two-dimensional shape by use of the measured physical amount. Then, whether the photomask can be used or not is determined based on the derived lithography tolerance.

15 Claims, 16 Drawing Sheets

PHOTOMASK MANAGEMENT METHOD AND PHOTOMASK WASH LIMIT GENERATING METHOD

CROSS-REFERENCE TO RELATED APPLICATIONS

This application is based upon and claims the benefit of priority from prior Japanese Patent Application No. 2007-121027, filed May 1, 2007, the entire contents of which are incorporated herein by reference.

BACKGROUND OF THE INVENTION

1. Field of the Invention

This invention relates to a photomask management method used in a photolithography process when a semiconductor integrated circuit device is manufactured and a photomask wash limit generating method, and more particularly to a photomask management system using the above methods.

2. Description of the Related Art

Recently, when a semiconductor integrated circuit device, for example, a semiconductor memory device is manufactured, the integration density of interconnects and elements configuring a circuit is enhanced and a pattern is increasingly miniaturized. In order to form a pattern on a wafer by exposing a photomask in photolithography, it is said necessary to use KrF light up to the generation of 0.09 μm and ArF light after the generation of 0.07 μm as exposure light.

However, in a case where photomasks are used in a semiconductor manufacturing facility, growth defects occur on a photomask of the ArF generation if it is kept used. As a result, an increase in the line width or a line-to-line short occurs in a transfer pattern and is detected in a wafer defect checking step, thus causing a problem that the device yield is lowered.

Further, the growth defects occurring on the photomask can be eliminated by washing the photomask and the washed photomask can be returned to and reused in the semiconductor manufacturing facility (for example, refer to Jpn. Pat. Appln. KOKAI Publication No. 2004-40038). However, since damages are caused in a halftone (HT) film by washing the photomask, the transmittance and phase difference are varied to reduce the exposure margin.

Therefore, when photomasks are first shipped from the mask manufacturing process to the photolithography process for device manufacturing (in an unused state), photomasks in which the phase differences and transmittances of the films are already largely deviated from ideal values contain masks which cannot be washed any more, that is, which cannot be used any more even if they are washed although they satisfy the specification.

In the conventional flow of eliminating the growth defects, first, a desired mask pattern is drawn in a mask manufacturing process. Then, a development step and etching step are performed to form a photomask pattern. Next, a photomask washing step is performed. After this, a defect checking step is performed with desired checking sensitivity. If it is detected in the checking step that foreign matter is attached (the photomask is determined to be defective), the checking step is performed again after the washing step is performed. Then, the washing step and defect checking step are repeatedly performed until the foreign matter is removed (the photomask is determined to be serviceable).

After this, an exposure margin is calculated based on an optical measurement result and dimension measurement result acquired from a measurement database according to the optical measurement and dimension measurement procedures in the mask manufacturing process.

Specifically, the transmittance and the phase difference of a halftone film of a desired portion are measured in the optical measurement step. Then, the dimension measurement of a desired pattern is made in the dimension measurement step. The optical measurement and dimension measurement data items are stored in the measurement database. The measurements are transferred to a determining system which determines the flexible specification of the present mask and an exposure (lithography) margin is calculated in a desired optical condition.

In this case, the exposure (lithography) margin thus calculated is compared with a permissible exposure (lithography) margin previously defined to determine whether the mask is serviceable or defective.

If the determination result indicates that the mask is defective, a mask starts to be manufactured starting from the mask drawing step again. If the determination result indicates that the mask is serviceable, a defect checking step is performed. If it is detected in the checking step that foreign matter is attached (defective), the washing step is performed again and then the checking step is performed again. After this, the above routine is repeated until the process to the checking step after the optical measurement step, dimension measurement step and flexible specification determining step are performed is determined to be serviceable.

In the above checking step, a photomask which is determined to be serviceable is transferred to a photolithography process for device manufacturing after a pellicle attaching step. After the photomask is transferred to the photolithography process for device manufacturing, first, an exposure condition is determined by use of a lithography margin management pattern and an adequate exposure value is acquired.

Further, an exposure step is performed by use of the above adequate exposure value and a defect checking step (mask contamination confirmation step) is performed by use of a desired number of days or exposure processes. If the checking result indicates a serviceable mask, an exposure step is performed by use of the adequate exposure value, a defect checking step (mask contamination confirmation step) is performed again by use of a desired number of days or exposure processes and the above routine is repeated until the checking result indicates a defective mask (foreign matter detected).

If the checking result indicates a defective mask, the photomask is transferred to the mask manufacturing process. First, a pellicle is separated from the photomask and the washing step is performed. Further, the checking step, optical measurement step, dimension measurement step and flexible specification determining step are performed. After this, a photomask which is determined to be serviceable is transferred again to the photolithography process for device manufacturing after the checking step and pellicle attaching step are performed and then the above process is repeated.

However, in the case of the conventional photomask checking method, although a lithography margin is not ensured for a borderline pattern in which the lithography tolerance is small when a photomask is actually used in the flexible specification determining step in the mask manufacturing process, it is erroneously determined that the photomask can be used and the yield is lowered in the device manufacturing process in some cases. On the other hand, although a lithography margin is ensured for a borderline pattern in which the lithography tolerance is small, it is erroneously determined that the photomask cannot be used and there occurs a possibility that the photomask is wastefully discarded (for example, refer to Japanese Patent Specification No. 3425414).

Further, only the quality determination is made in the flexible specification determining step. Therefore, when the photomask is used in the photolithography process for device manufacturing, information as to how many times the mask can be washed, that is, the number of washing steps which can be further performed cannot be acquired. As a result, it is difficult to determine whether or not the mask washing step can be performed after the mask is once contaminated, that is, whether or not the mask can be still used even after the mask washing step is performed.

When the contaminated mask is washed in the mask manufacturing process after the photolithography process for device manufacturing while the above determination cannot be made, an optical measurement result and dimension measurement result are acquired and then a flexible determination step is performed. However, if the photomask should be determined to be defective in the flexible determination step, it becomes necessary to form a mask again. In this case, there occurs a problem that it takes a long time to return the photomask to the photolithography process for device manufacturing and, as a result, a device product manufacturing process using the photomask in the photolithography process for device manufacturing is delayed.

BRIEF SUMMARY OF THE INVENTION

According to a first aspect of the present invention, there is provided a photomask management method which includes washing a photomask, measuring at least one physical amount of transmittance and phase difference of the photomask, dimension of a pattern, height of the pattern and a sidewall shape of the pattern after the washing, measuring a two-dimensional shape of a borderline pattern previously determined for the photomask after the washing, deriving lithography tolerance by performing a lithography simulation for the measured two-dimensional shape by use of the measured physical amount, and determining whether the photomask can be used based on the derived lithography tolerance.

According to a second aspect of the present invention, there is provided a photomask wash limit generating method which includes washing a photomask, measuring at least one physical amount of transmittance and phase difference of the photomask, dimension of a pattern, height of the pattern and a sidewall shape of the pattern after the washing, deriving present lithography tolerance based on the measured physical amount, previously deriving a relationship between the number of photomask washes and the physical amount, deriving a relationship between the number of washes and the lithography tolerance by deriving the lithography tolerance based on the physical amount depending on the number of washes, and generating the photomask wash limit based on the present lithography tolerance, predetermined permissible lithography tolerance and the relationship between the number of washes and the lithography tolerance.

According to a third aspect of the present invention, there is provided a photomask wash limit generating method which includes washing a photomask, measuring at least one physical amount of transmittance and phase difference of the photomask, dimension of a pattern, height of the pattern and a sidewall shape of the pattern after the washing, measuring a two-dimensional shape of a borderline pattern previously determined for the photomask after the washing, deriving present lithography tolerance by performing a lithography simulation for the measured two-dimensional shape by use of the measured physical amount, previously deriving a relationship between the number of photomask washes and the physical amount, deriving a relationship between the number of washes and lithography tolerance by deriving the lithography tolerance for the physical amount depending on the number of washes, and generating the photomask wash limit based on the present lithography tolerance, predetermined permissible lithography tolerance and the relationship between the number of washes and the lithography tolerance.

According to a fourth aspect of the present invention, there is provided a photomask management system including a database which holds the wash limit of a photomask formed by one of the photomask wash limit generating methods according to the second and third aspects, a database which holds a defect occurrence frequency of the photomask previously measured, and a database which holds an exposure frequency of the photomask previously determined, wherein the service life of the photomask is predicted based on the wash limit, defect occurrence frequency and exposure frequency.

DETAILED DESCRIPTION OF THE INVENTION

First Embodiment

Figure 10:
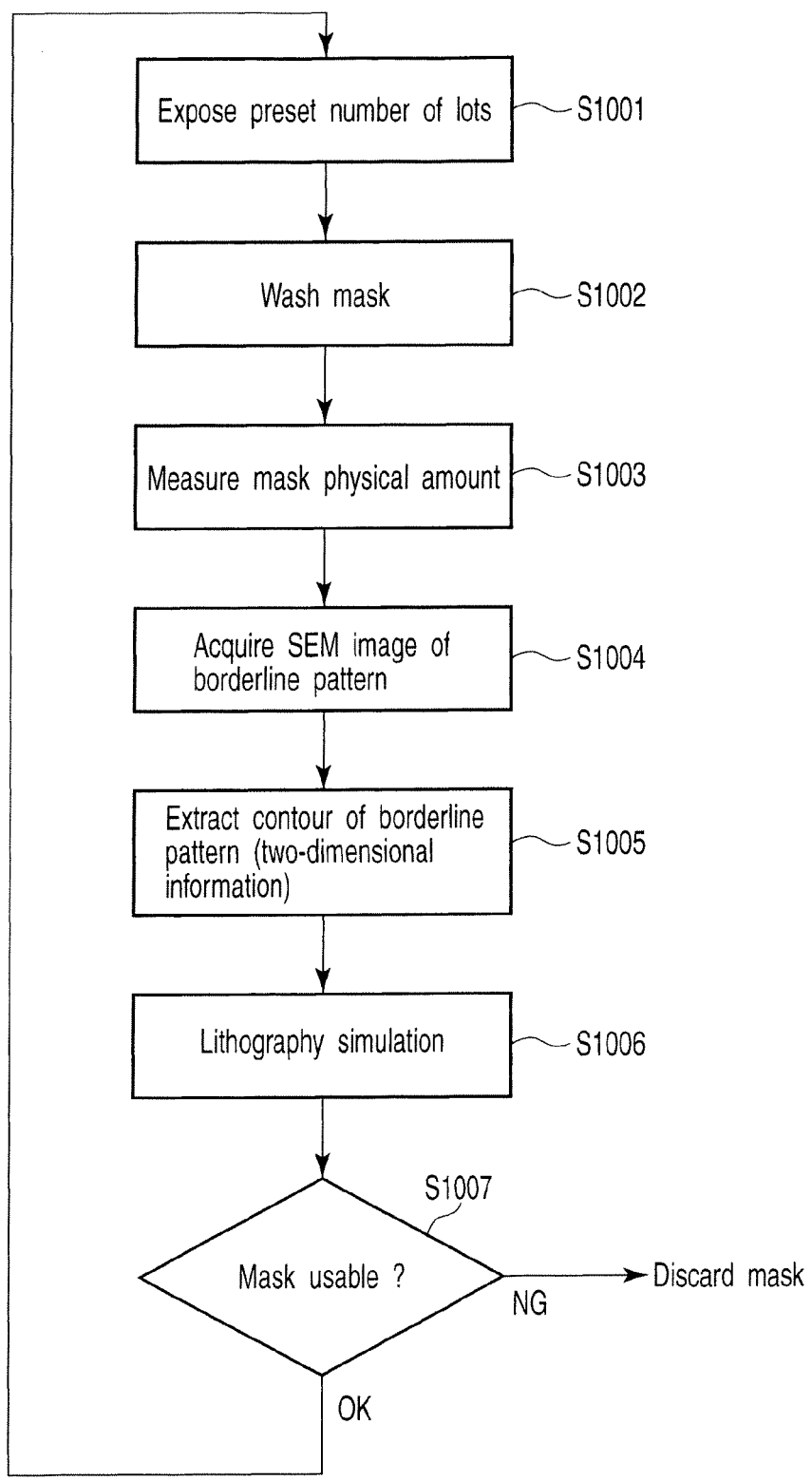
FIG. 10 is a flowchart for illustrating a photomask management method according to a first embodiment of this invention.

A photomask management method according to a first embodiment of this invention will be explained below with reference to the flowchart shown in FIG. 10.

In the photomask management method of this embodiment, physical amounts such as the dimension (CD), phase difference and transmittance of a photomask pattern are measured after a photomask washing step is performed to cope with growth defects (contamination materials) occurring on the photomask and then a pattern image having no lithography tolerance is acquired. Whether the photomask can be used or not is determined by doing a lithography simulation for the pattern whose image is acquired and which has no lithography tolerance by use of the actually measured physical amounts obtained in the above measurement process.

Figure 1:
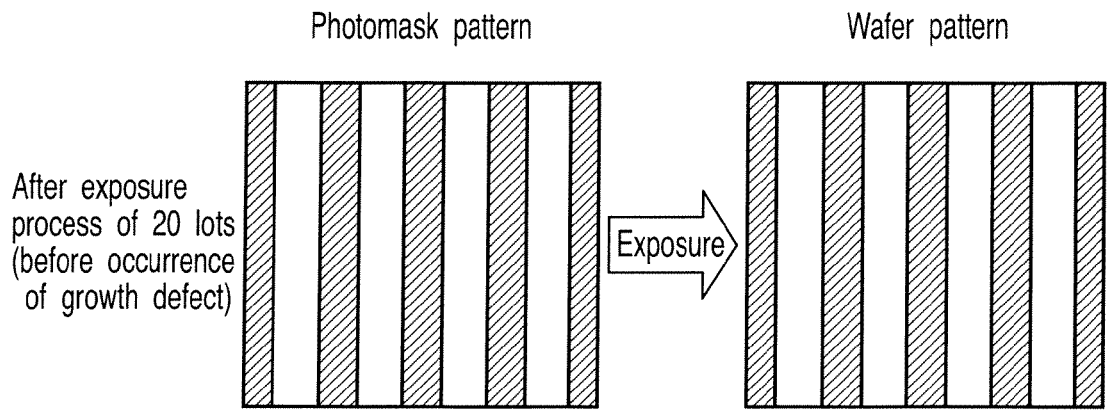
FIG. 1 is a pattern plan view showing the state before growth defects of a photomask pattern and wafer pattern occur.
Figure 2:
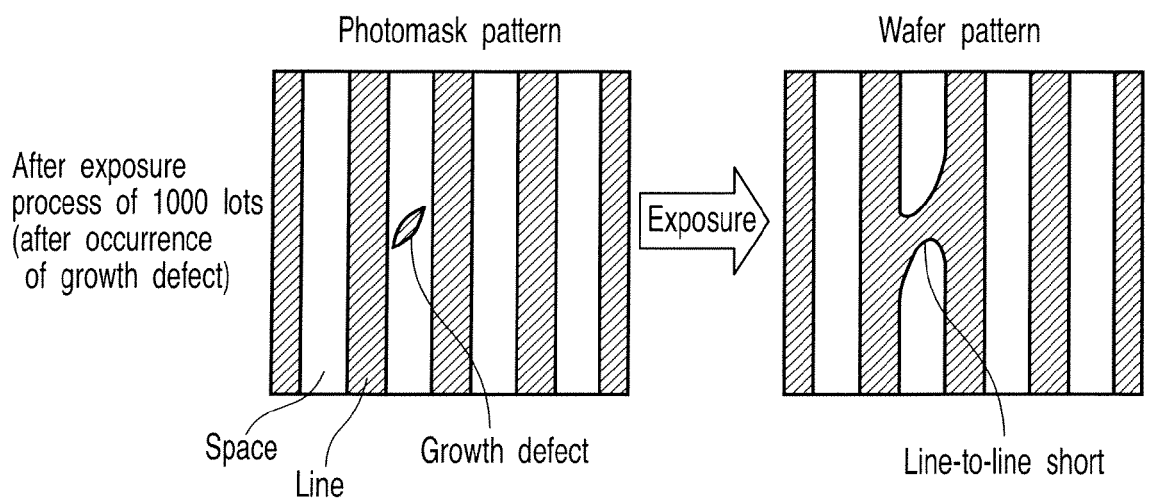
FIG. 2 is a pattern plan view showing the state in which growth defects of a photomask pattern and wafer pattern occur.

When a photomask of ArF generation is used in a semiconductor manufacturing facility and if the photomask initially used to form wafer patterns as shown in FIG. 1 without causing any problem is continuously used, a growth defect occurs on the photomask as shown in FIG. 2. As a result, the line width becomes large or a line-to-line short occurs in a transfer pattern and the phenomenon is detected in a wafer defect checking step. Thus, there occurs a problem that the device yield is lowered.

Figure 3:
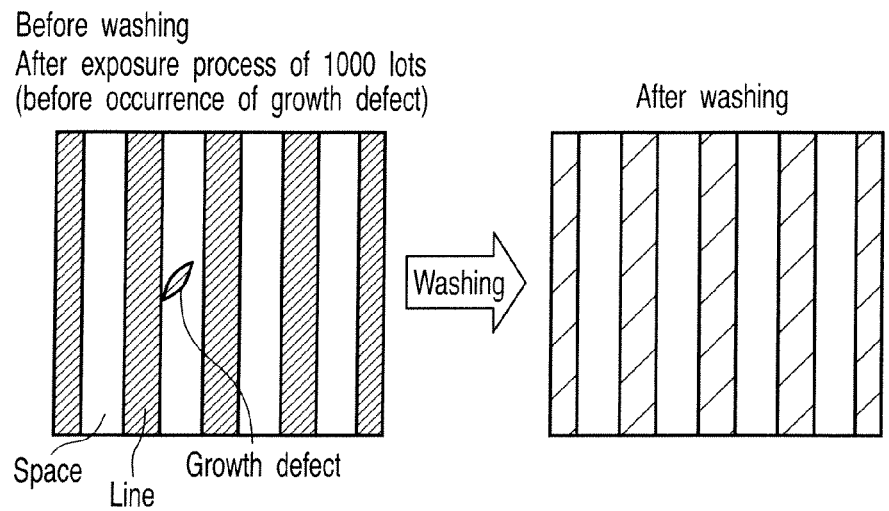
FIG. 3 is a pattern plan view showing patterns before and after washing, for illustrating the state in which the generated growth defect is eliminated by washing.

As shown in FIG. 3, the growth defect can be eliminated by washing. The washed photomask can be returned to and reused in the semiconductor manufacturing facility. The washing step is performed by, for example, washing a photomask by use of a mixed solution of hydrolytic sulfuric acid and ammonium and rinsing the photomask by use of warm water (pure water) after washing. The washing step is performed not only at the returning/reusing time but also at the time of formation of a photomask.

Figure 4:
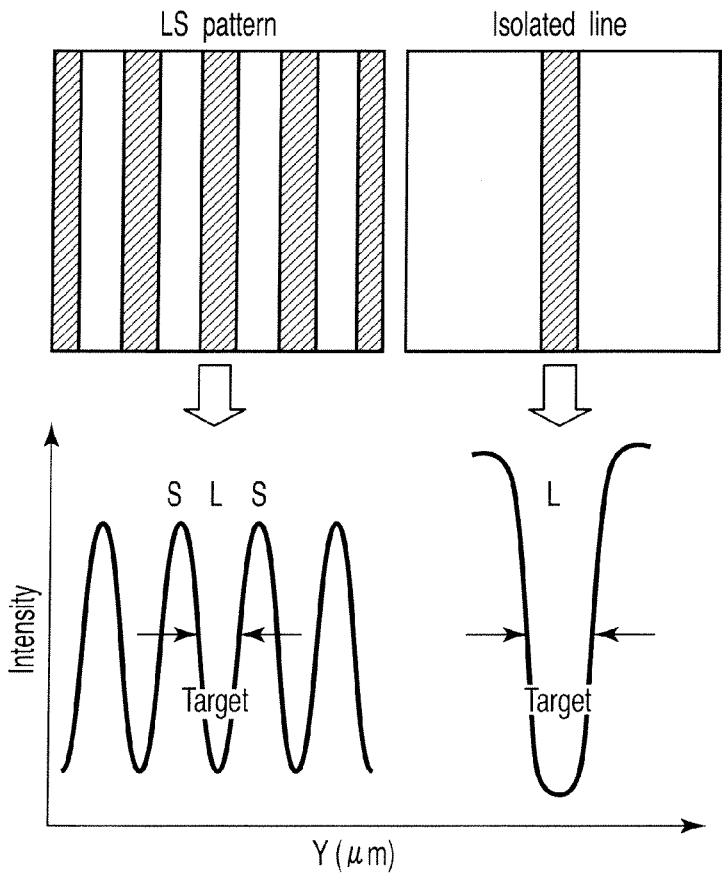
FIG. 4 is a view showing a line & space pattern in comparison with an isolated line, for illustrating the intensity of light transmitted through a photomask before washing.
Figure 5:
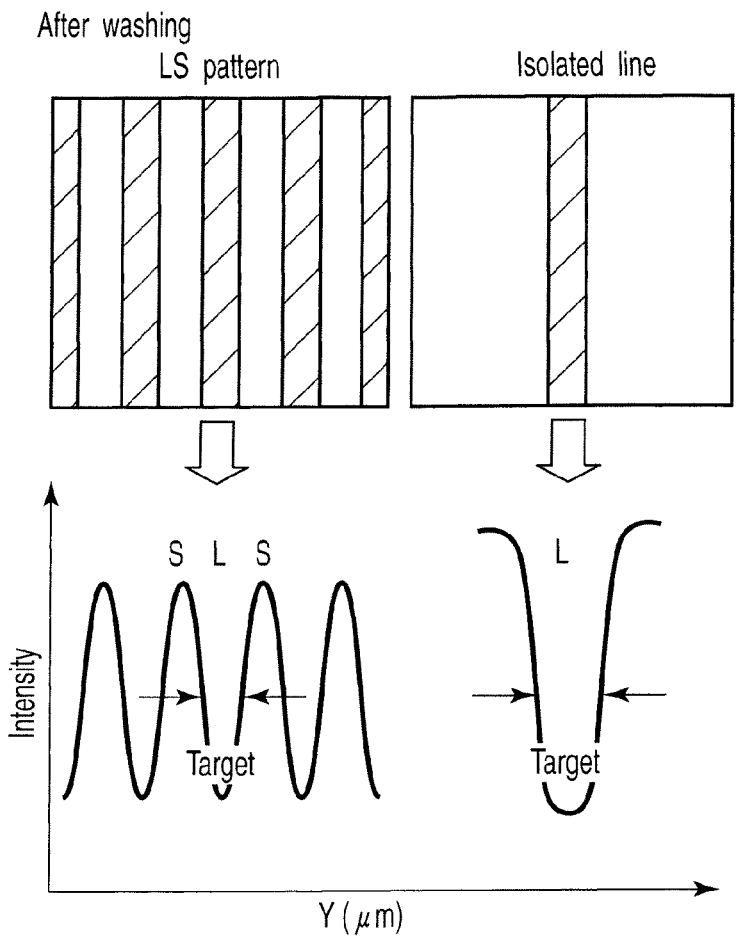
FIG. 5 is a view showing a line & space pattern in comparison with an isolated line, for illustrating the intensity of light transmitted through a photomask after washing.

However, damages are given to a halftone film when the photomask is washed and the pattern of the intensity of light passing through the photomask varies from the state of FIG. 4 before washing to the state of FIG. 5 after washing. As a result, the transmittance and phase difference are varied and, for example, the tolerance of an exposure value for desired depth of focus (DOF)=$D_1$ is decreased from a value $EL_B$ showing an ED tree before washing as shown in FIG. 6 to a value $EL_A$ showing an ED tree after washing as shown in FIG. 7.

The ED tree is a diagram in which the exposure value (dose) is taken on the abscissa and the focus is taken on the ordinate and which indicates the ranges of the exposure value and focus permitted to vary from respective optimum points on an exposure value-focus (dose-focus) space when the dimension of the resist pattern on a wafer is permitted to be deviated at a preset rate.

Figure 6:
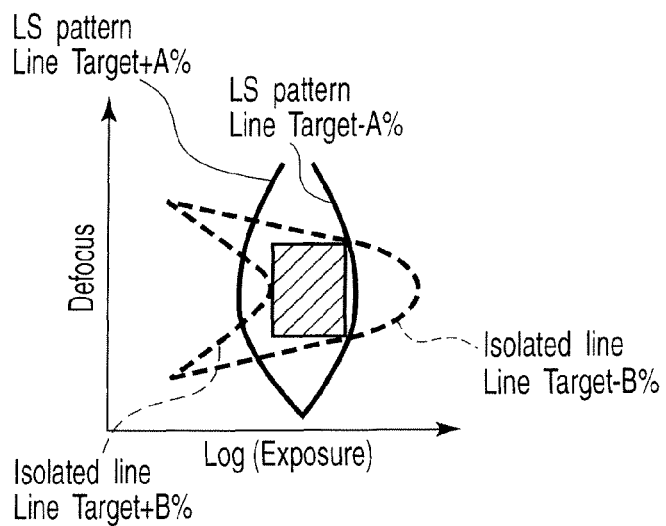
FIG. 6 is a characteristic diagram showing an ED tree before washing.
Figure 7:
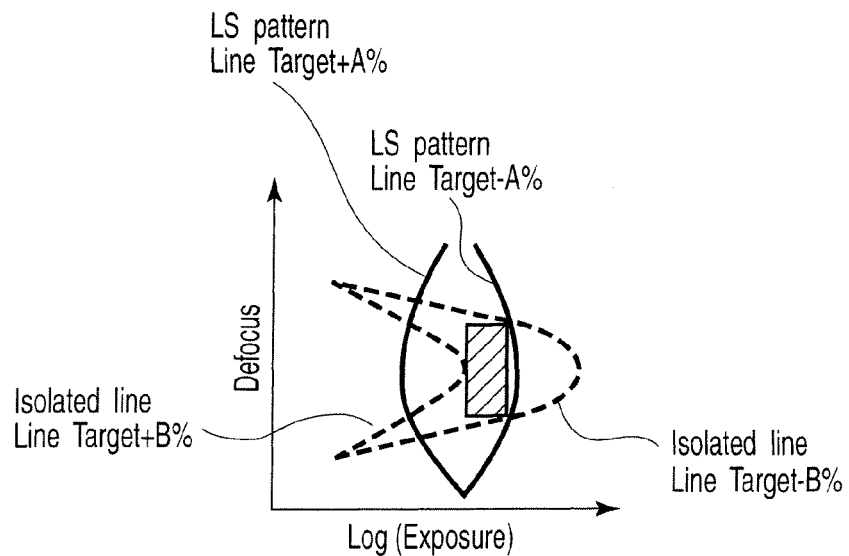
FIG. 7 is a characteristic diagram showing an ED tree after washing.

In FIGS. 6 and 7, dose-focus values at which respective isolated lines are set to (pattern dimension±B %) are connected by use of broken lines. That is, first, an isolated line pattern in which the exposure value and focus are set to optimum values at an optimum point is considered. The dimension of the isolated line pattern obtained when the exposure value and focus deviate from the optimum point is taken in a direction perpendicular to the ordinate and abscissa or perpendicular to the paper sheet and a pattern obtained by forming an equidimensional curve on which the isolated lines are set to (pattern dimension±B %) is projected onto the paper sheet. Thus, an area surrounded by the broken lines indicates a range in which the exposure value and focus are permitted to be deviated from the optimum point as a process margin in which the isolated lines are kept set to (pattern dimension±B %).

Figure 8:
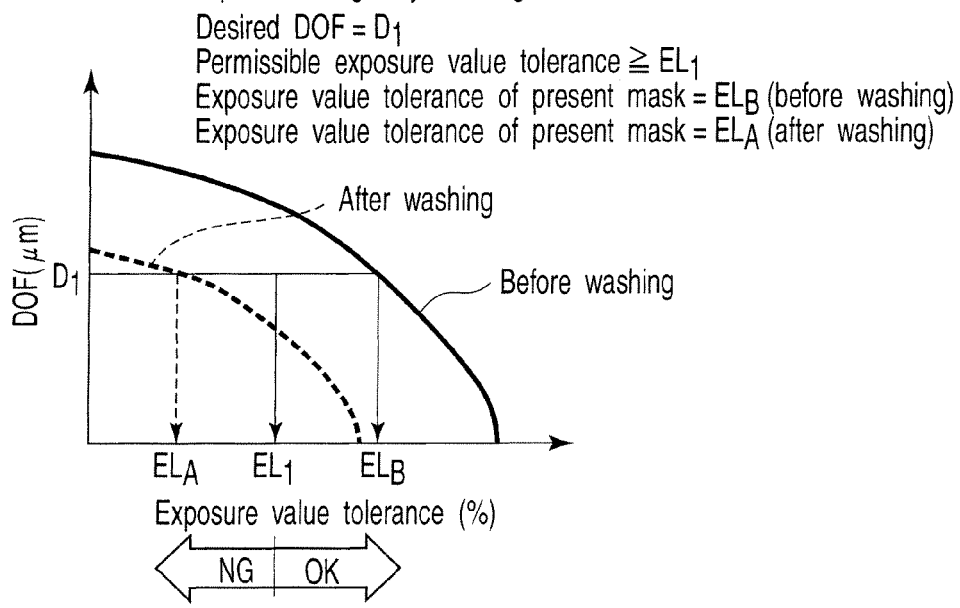
FIG. 8 is a characteristic diagram showing deterioration in the lithography margin by washing.

FIG. 8 shows a variation in the exposure value tolerance before and after washing with respect to the desired depth of focus (DOF)=$D_1$ shown in FIGS. 6 and 7 by changing the DOF and plotting the values. As shown in FIG. 8, the lithography margin is reduced by washing the photomask.

Figure 9:
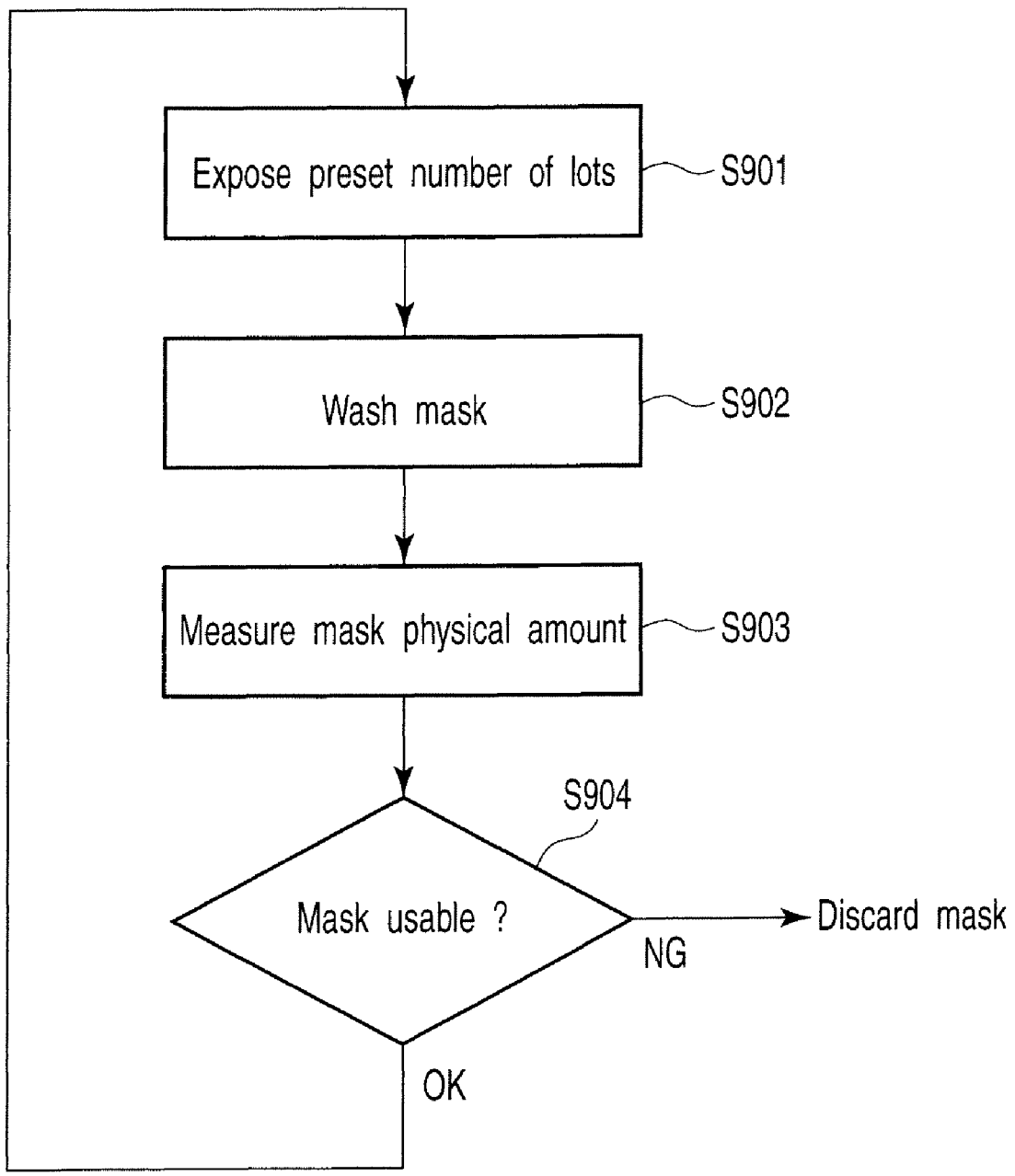
FIG. 9 is a flowchart for illustrating the conventional photomask management method.

Whether the photomask after washing can be used or not is conventionally determined by a procedure as shown in the flowchart of FIG. 9 in order to cope with a reduction in the lithography margin by washing the photomask. That is, a photomask is washed (step S902) after a preset number of exposures (step S901) and then physical amounts such as transmittance and phase difference of the photomask, dimension of a pattern, height of the pattern and a sidewall shape of the pattern are measured (step S903).

In step S903, all of the above physical amounts may be measured but at least one of the physical amounts can also be measured and used.

Whether the photomask after washing can be used or not is determined by using the specification derived in the mask manufacturing process based on the above measurement result as a reference (step S904). Alternatively, a lithography margin is estimated based on the measured physical amount and whether the photomask after washing can be used or not is determined based on whether the lithography margin satisfies a desired value or not.

The photomask which is determined to be unusable in the photomask usability determining step in step S904 is discarded and the photomask which is determined to be usable is used again in the semiconductor device manufacturing process and repeatedly subjected to the exposure step (step S901).

However, the physical amount measured in the conventional step S903 is not a parameter directly related only to a borderline pattern which has small lithography tolerance and makes it difficult to form a desired pattern due to a slight variation in the exposure condition.

Therefore, when whether the photomask after washing can be used or not is determined by use of the above method, it is erroneously determined that the photomask can be used although the lithography margin is not ensured for a borderline pattern actually formed by use of the photomask and having small lithography tolerance. Thus, the manufacturing yield in the semiconductor device manufacturing process is lowered in some cases. Further, it is erroneously determined that the photomask cannot be used although the lithography margin is ensured for a borderline pattern having small lithography tolerance and there occurs a possibility that the photomask is wastefully discarded.

In the photomask management method of this embodiment, whether a photomask in which the physical characteristics and the like are varied by the washing process can be used or not can be more precisely determined.

The photomask management method according to this embodiment is explained below with reference to the flowchart of FIG. 10.

First, a preset number of lots, for example, 450 lots are exposed (step S1001) and then a photomask is washed (step S1002). If the photomask washing step is performed as a washing step at the photomask formation time, step S1001 is omitted.

After this, one or plural physical amounts among physical amounts such as the transmittance and phase difference of the photomask, dimension of the pattern, height of the pattern and a sidewall shape of the pattern are measured (step S1003).

In the measurement of the physical amounts in step S1003, for example, the transmittance, phase difference and the like are measured by optical measurement. Further, for example, the dimension of the photomask pattern is a dimension of a representative pattern portion based on which the finished state of the mask can be confirmed and which is required to be formed with sufficiently large lithography tolerance. The dimension may be measured based on an image acquired by use of a scanning electron microscope (SEM) or may be measured by use of an optical measurement device.

The height of the photomask pattern can be derived based on the measured phase difference or can be measured by use of an atomic force microscope (AFM). Further, for example, the sidewall shape of the pattern is the sidewall shape of a line pattern formed of a halftone mask or glass. Information relating to the 3-dimensional structure indicating whether the sidewall shape is a tapered shape or reversely tapered shape and the degree of the tilt of the sidewall is acquired by use of a reflection light beam of an electron beam (EB) or atomic force microscope (AFM).

In the present embodiment, after the measurement step of step S1003, a scanning electron microscope (SEM) image of a preset borderline pattern is acquired from the patterns on the photomask (step S1004).

For example, the borderline pattern is obtained by previously extracting a pattern having relatively small lithography tolerance or the smallest lithography tolerance from all of the patterns on the photomask by performing a lithography simulation based on mask pattern data. In the lithography simulation, information containing the ideal exposure condition of the lithography process and the characteristic of the exposure device relating to a deviation from the ideal condition, for example, actual measurement data items of lens aberration, illumination luminance irregularity and polarization of light can be used.

Alternatively, a pattern which is initially known as a pattern having small lithography tolerance is previously set as a management pattern and may be used as a borderline pattern.

Then, the contour of the borderline pattern, that is, two-dimensional information is extracted based on image data acquired in step S1004 (step S1005). A lithography simulation is done (step S1006) for the actually measured two-dimensional data of the borderline pattern thus acquired by use of the physical amount measured in step S1003. Thus, a transfer pattern of the borderline pattern on the wafer is derived. In this case, it is assumed that the physical amounts which are not measured in step S1003 are not varied in the washing step and the lithography simulation can be done by use of standard values at the photomask shipping time.

In the lithography simulation of step S1006, specifically, when the exposure condition is varied due to the characteristic of the exposure device and the other causes, the dimension or shape to which the transfer pattern of the borderline pattern on the wafer is set is derived.

Then, whether the photomask after washing can be used or not is determined based on the result of the lithography simulation of step S1006 (step S1007). Specifically, the deviation of the dimension or shape of the borderline pattern on the wafer derived in step S1006 with respect to that of the desired pattern, that is, dimensional tolerance is measured or the degree of coincidence in shape with the desired pattern is derived. By comparing the dimensional tolerance or the degree of coincidence in shape with a corresponding preset threshold value, whether the lithography margin is attained or not is determined to determine whether the photomask can be used or not.

The lithography tolerance is an index indicating a range in which the exposure conditions such as the exposure value and focus are permitted to vary when a dimensional deviation of a pattern formed by actual exposure with respect to a desired pattern formed under an ideal exposure condition is permitted by a preset amount. Therefore, the determination step in step S1007 determines whether the photomask can be used or not based on the lithography tolerance derived by the lithography simulation.

Conventionally, whether the photomask after washing can be used or not is determined by using the transmittance and phase difference after washing in the lithography simulation and calculating the lithography tolerance. However, in the present embodiment, the physical amounts such as the phase difference, transmittance and CD (dimension) after washing are measured and, additionally, two-dimensional data of a preset borderline pattern having small lithography tolerance is actually measured. The two-dimensional data is subjected to the lithography simulation by use of the measurements of the physical amounts that are varied by washing and whether the photomask can be used or not is determined.

Thus, whether the photomask whose physical characteristics are varied can be used or not can be more precisely determined by washing the mask at the photomask returning/reusing time.

As a result, since the lithography margin can be adequately ensured for the borderline pattern, the manufacturing yield of semiconductor devices manufactured by use of the photomask can be enhanced. At the same time, since an over-specified request is not made for the photomask in the photomask usability determining step, the photomask can be avoided from being wastefully discarded and the cost thereof can be lowered.

Second Embodiment

A photomask wash limit generating method according to a second embodiment of this invention is explained below with reference to the process flow shown in FIG. 14.

In the photomask wash limit generating method of the present embodiment, the wash limit indicating how many times a photomask can be washed while it has a sufficient lithography margin is calculated after a washing step of the photomask in the mask manufacturing process.

Generally, at the time point (in an unused state) when a photomask is first shipped from the mask manufacturing process to the photolithography process for device manufacturing, the transmittance and phase difference of a film are already largely deviated from the respective ideal values in some cases.

As shown in FIG. 8, since damages are given to the halftone film when the photomask is washed, the transmittance and phase difference deviate and the exposure margin is reduced. Therefore, photomasks which cannot be washed any longer, that is, which will immediately become unusable even if they are washed are contained in photomasks in which the specification is satisfied but the transmittance and phase difference of the film are already largely deviated from the respective ideal values.

Figure 11:
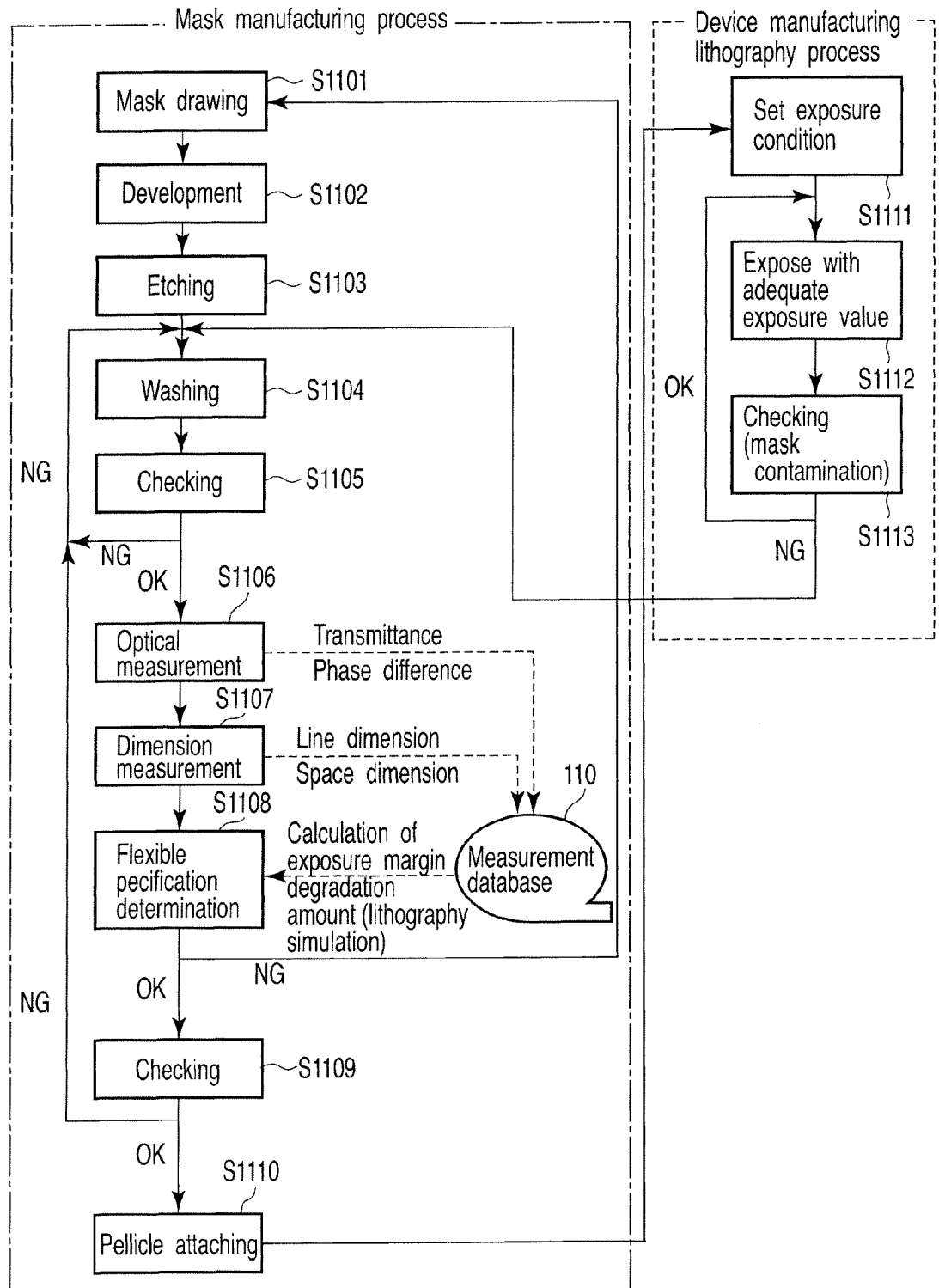
FIG. 11 is a flowchart showing the conventional growth defect washing flow.

Before explaining the photomask wash limit generating method according to the present embodiment, the conventional photomask management method is explained for comparison. FIG. 11 shows one example of the conventional growth defect elimination flow.

First, in the mask manufacturing process, a desired mask pattern is drawn (step S1101). Then, a development step (step S1102) and etching step (step S1103) are performed to form a photomask pattern.

Next, the photomask is washed (step S1104) and then a defect checking step with desired checking sensitivity is performed (step S1105). If it is determined by the defect checking step that foreign matter is attached (NG), the checking step is performed again (step S1105) after the washing step is performed (step S1104) and the above routine is repeated until it is determined that the foreign matter is eliminated (OK).

When it is determined that the foreign matter is eliminated (OK), the transmittance and phase difference of a halftone film of a desired portion are measured in an optical measurement step (step S1106). Then, the dimension of a space or line of a representative pattern is measured to confirm a finished state of a photomask in a dimension measurement step (step S1107). The optical measurement step (step S1106) and dimension measurement step (step S1107) correspond to the physical amount measurement step (step S903) of the mask in FIG. 9.

Figure 12:
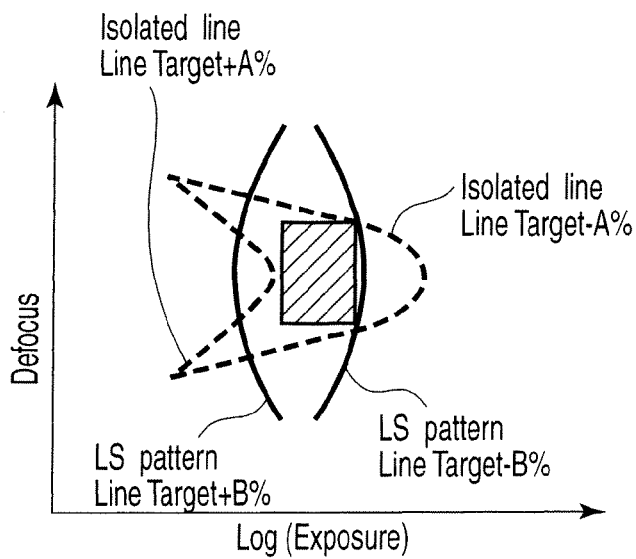
FIG. 12 is a characteristic diagram showing an ED tree derived based on the measurement result in the mask manufacturing process.

The optical measurement data (transmittance and phase difference) and dimension measurement data are stored in a measurement database 110. The measurement data items are transferred from the measurement database 110 to a flexible specification determining system (not shown) which determines a flexible specification of the photomask (step S1108). Since an ED tree is derived under a desired optical condition as shown in FIG. 12 based on the measurement data items, exposure (lithography) tolerance as shown in FIG. 13 can be calculated under a desired optical condition.

Figure 13:
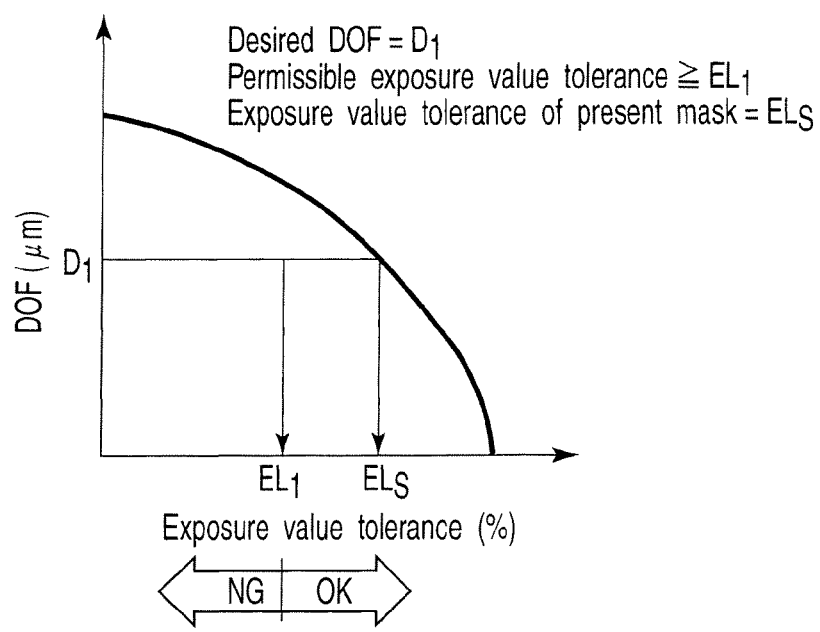
FIG. 13 is a characteristic diagram showing lithography tolerance derived based on the measurement result in the mask manufacturing process.

In the flexible specification determining step (step S1108), whether the photomask is serviceable or not is determined by using previously defined permissible exposure (lithography) tolerance with respect to the exposure (lithography) tolerance of the photomask derived as shown in FIG. 13.

If it is determined in the above determination step that the photomask is defective (NG), the mask forming process is started from the mask drawing step (step S1101). When it is determined that the photomask is serviceable (OK), a defect checking step is performed (step S1109) and if it is detected in the checking step that foreign matter is attached (NG), the defect checking step is performed (step S1105) after the washing step is performed (step S1104) again. Further, the optical measurement step (step S1106), dimension measurement step (step S1107) and flexible specification determining step (step S1108) are performed and the above routine is repeated until it is determined in the defect checking step (step S1109) that the photomask is serviceable (OK).

The photomask determined to be serviceable in the defect checking step (step S1109) is subjected to a pellicle (dust-proof protection film) attaching step (step S1110) and then transferred to a photolithography process for device manufacturing.

After the photomask is transferred to the photolithography process for device manufacturing, first, an exposure condition is set by use of a lithography margin management pattern and an adequate exposure value is derived (step S1111). Next, exposure for a preset number of days or a preset number of exposure processes is performed by use of the adequate exposure value derived in step S1111 (step S1112).

After this, a defect checking step (mask contamination step) (step S1113) is performed. When the checking result indicates a serviceable product (OK), exposure for a preset number of days or a preset number of exposure processes is performed again by use of the adequate exposure value derived in step S1111 (step S1112) and then a defect checking step (step S1113) is performed.

The above routine is repeated until the result of the defect checking step (step S1113) indicates NG (detection of foreign matter). In the case of NG (detection of foreign matter), the photomask is transferred to the mask manufacturing process and the pellicle is separated from the photomask (not shown). Then, the photomask is washed (step S1104), and after the checking step (step S1105), optical measurement step (step S1106), dimension measurement step (step S1107) and flexible specification determining step (step S1108) are performed, the photomask determined to be serviceable (OK) in the checking step (step S1109) is subjected to the pellicle attaching step (step S1110) and transferred to a photolithography process for device manufacturing. The above process is repeatedly performed.

In the conventional growth defect elimination flow shown in FIG. 11, the following problems occur.

A photomask used in the photolithography process for device manufacturing is used only to determine whether the mask can be used or not in the flexible specification determining step (step S1108) in the mask manufacturing process. Therefore, information indicating how many times the photomask can be subjected to a mask washing step after this, that is, how many times the photomask can be washed while the characteristic of the photomask is kept maintained so that the photomask can be used is not acquired at the time of the defect checking step (step S1113) in the photolithography process for device manufacturing. Therefore, it is difficult to determine whether the photomask can actually be subjected to the mask washing step after this at the time point if NG (detection of foreign matter) is determined in the defect checking step (step S1113). That is, when the photomask is subjected to the mask washing step after this, whether the photomask is actually reusable or immediately becomes unusable by washing cannot be determined (Problem 1).

Further, when a contaminated mask is transferred from the photolithography process for device manufacturing to the mask manufacturing process, it becomes necessary to perform a process from the washing step (step S1104) in the mask manufacturing step to the optical measurement and dimension measurement steps (steps S1106 and S1107). Then, completion of the washing step is determined in the flexible specification determining step (step S1108) performed after this. However, in this case, if the photomask should be determined to be defective (NG), it is necessary to return the process to step S1101 to restore a photomask and there occurs a problem that it takes a long time to return the photomask to the photolithography process for device manufacturing. Therefore, in the photolithography process for device manufacturing, the device product manufacturing process using the photomask may be delayed (Problem 2).

On the other hand, in the photomask wash limit generating method according to the present embodiment, the above problems can be solved by calculating the wash limit indicating the number of times the photomask can be washed while maintaining a lithography margin after the photomask is subjected to the washing step in the mask manufacturing process.

The photomask wash limit generating method according to the present embodiment is explained below with reference to the flowchart of FIG. 14.

First, in the mask manufacturing process, a desired mask pattern is drawn (step S1401). Then, a development step (step S1402) and etching step (step S1403) are performed to form a photomask pattern. For example, the photomask manufactured at this time is a halftone phase shift mask.

Next, the photomask is washed (step S1404) and then a defect checking step with desired checking sensitivity is performed (step S1405). If it is determined by the defect checking step that foreign matter is attached (NG), the checking step is performed again (step S1405) after the washing step is performed (step S1404) and the above routine is repeated until it is determined that the foreign matter is eliminated (OK).

When it is determined that the foreign matter is eliminated (OK), the transmittance and phase difference of a halftone film of a desired portion are measured in an optical measurement step (step S1406). The measurement result is stored in the measurement database 140. Then, the dimension of a space or line of a representative pattern is measured to confirm a finished state of a photomask in a dimension measurement step (step S1407). The dimension may be measured based on an image acquired by use of a scanning electron microscope (SEM) or may be measured by use of an optical measurement device. Also, the measurement result is stored in the measurement database 140.

A physical amount such as the height of the pattern or the sidewall shape of the pattern can be measured in step S1407. The height of the photomask pattern may be calculated based on the phase difference measured in step S1406 or measured by use of an atomic force microscope (AFM). Further, information relating to the 3-dimensional structure indicating whether the sidewall shape of the pattern is a tapered shape or reversely tapered shape and the degree of the tilt of the sidewall is acquired by use of a reflection light beam of an EB or atomic force microscope (AFM).

Figure 14:
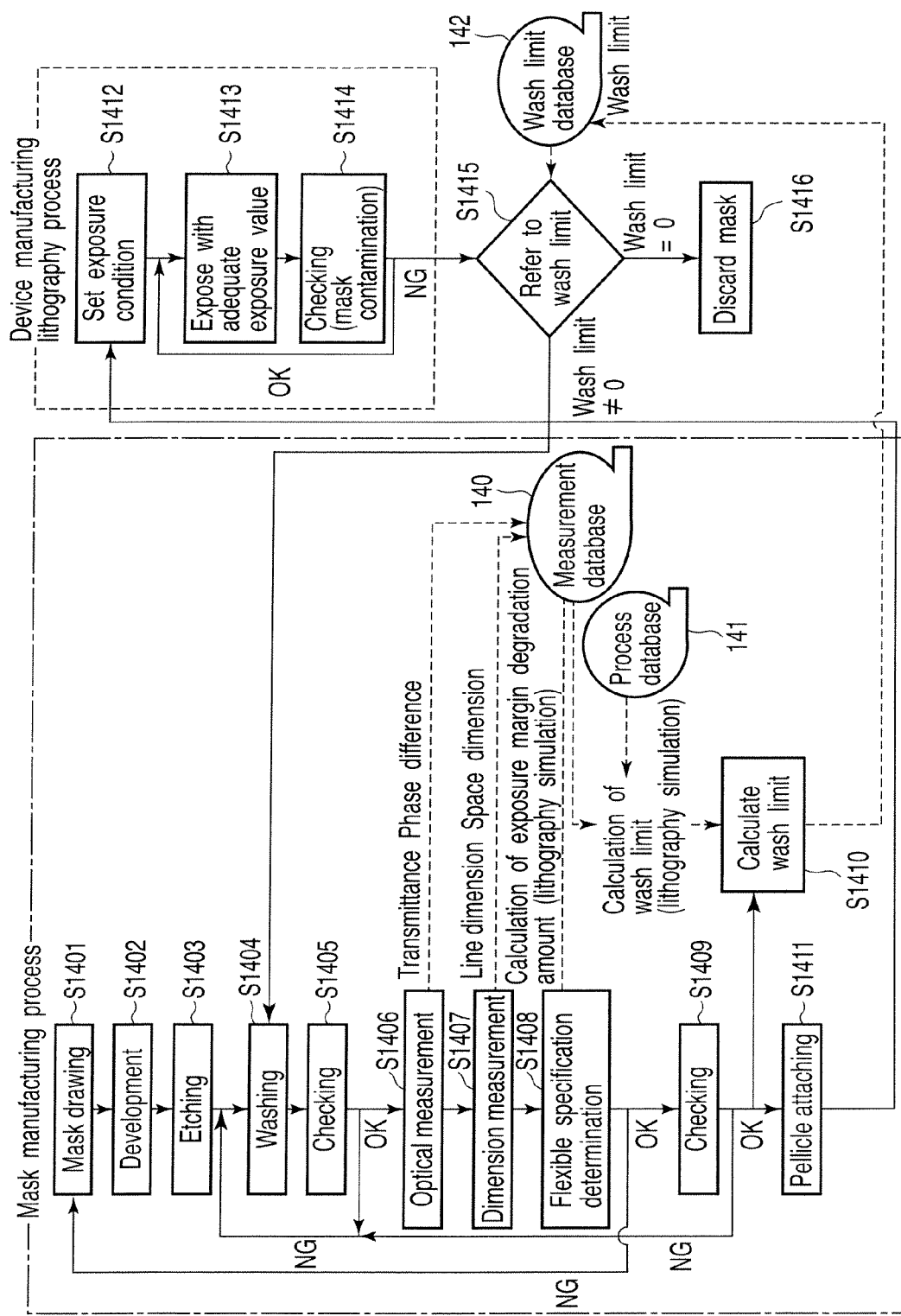
FIG. 14 is a flowchart showing a process flow of a photomask wash limit generating method according to a second embodiment of this invention.

It is not always necessary to separately provide steps S1406 and S1407 as shown in the flowchart of FIG. 14. For example, at least one physical amount or a plurality of physical amounts among the physical amounts such as the transmittance and phase difference of the pattern, the dimension of the pattern, the height of the pattern and the sidewall shape of the pattern may be measured.

After this, measurement data items obtained by the optical measurement and dimension measurement steps (steps S1406 and S1407) are transferred from the measurement database 140 into a flexible specification determining system (not shown) which performs a flexible specification determining step (S1408).

As shown in FIG. 13, the flexible specification determining system can calculate the present exposure (lithography) tolerance of the photomask under a desired optical condition based on the transferred measurement data items.

In the flexible specification determining step (step S1408), whether the photomask is usable or not is determined by using permissible exposure (lithography) tolerance previously defined with respect to the exposure (lithography) tolerance derived as shown in FIG. 13.

If the determination result indicates a defective photomask (NG), the mask manufacturing process is started again from the mask drawing step (step S1401). In the case of a serviceable photomask (OK), a defect checking step is performed (step S1409). If it is detected in the checking step that foreign matter is attached (NG), the defect checking step (step S1405) is performed again after the washing step (step S1404) is performed. Then, the optical measurement step (step S1406), dimension measurement step (step S1407) and flexible specification determining step (step S1408) are performed and the above routine is repeated until it is determined in the defect checking step (step S1409) that the photomask is serviceable (OK).

When the photomask is determined to be serviceable (OK) in the defect checking step (step S1409), measurement data items of the newest transmittance, phase difference and dimension data, stored for the photomask are transferred to a wash limit generating system (not shown). Further, data items of the transmittance and phase difference stored in a process database 141 and varying depending on the number of washes are transferred to the wash limit generating system.

Data items of the physical amounts such as the transmittance and phase difference stored in the process database 141 and varying depending on the number of washes are previously derived by theoretical estimation or previous measurement. Examples of data items of the physical amounts are shown in FIGS. 15 and 16.

Figure 15:
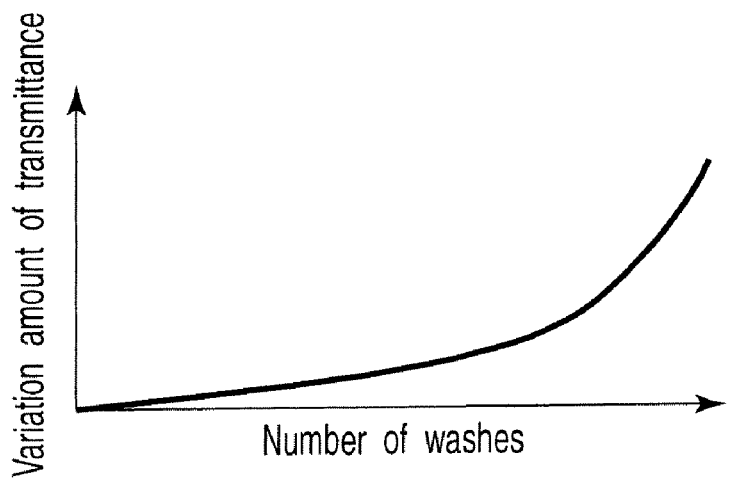
FIG. 15 is a characteristic diagram showing the transmittance of a photomask which varies depending on the number of washes.
Figure 16:
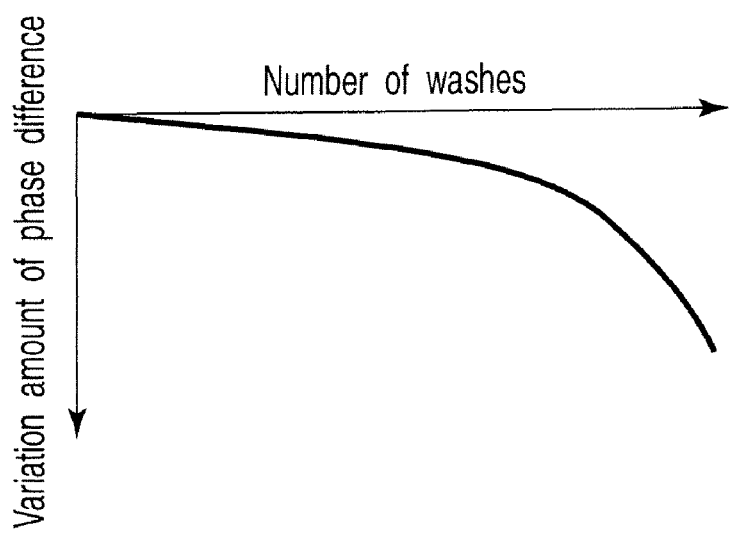
FIG. 16 is a characteristic diagram showing the phase difference of a photomask which varies depending on the number of washes.

FIG. 15 shows the transmittance which varies depending on the number of washes and shows the state in which the transmittance gradually increases (in an upward direction along the ordinate) starting from the initial transmittance of 6% of the halftone film with an increase in the number of washes. Further, FIG. 16 shows the phase difference which varies depending on the number of washes and shows the state in which the phase difference gradually decreases (that is, the film thickness of the halftone film decreases) (in a downward direction along the ordinate) starting from the initial phase difference of 180° of the halftone film and glass with an increase in the number of washes. The phase difference becomes zero if the washing step is repeatedly performed and the film thickness of the halftone film becomes zero.

When halftone phase shift masks manufactured by different manufacturing processes are present, data items of the physical amounts such as the transmittance and phase difference varying depending on the number of washes are previously derived for the respective manufacturing processes.

The wash limit generating system calculates exposure (lithography) tolerance under a desired optical condition for each number of washes performed after this based on the above data items of the physical amounts depending on the number of washes and transferred thereto. Specifically, as shown in FIG. 17, the exposure (lithography) tolerance for each number of washes is calculated based on the assumption that the photomask is further washed.

Figure 18:
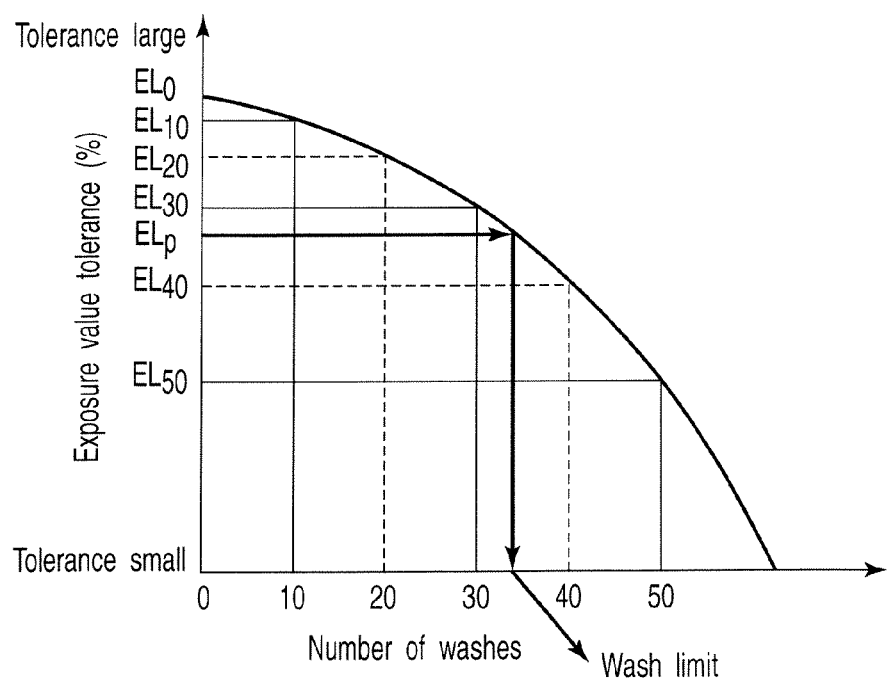
FIG. 18 is a characteristic diagram showing the exposure value tolerance for each number of washes.

Then, the wash limit indicating the number of times the photomask can be further washed is derived based on the relationship between the number of washes and the exposure value tolerance as shown in FIG. 18 by use of preset permissible exposure value tolerance ($EL_P$) and the present exposure value tolerance already derived in the flexible specification determining system (step S1410).

When photomasks manufactured by different manufacturing processes are present, exposure value tolerance derived for each number of washes derived at this time is derived for each manufacturing process.

Figure 17:
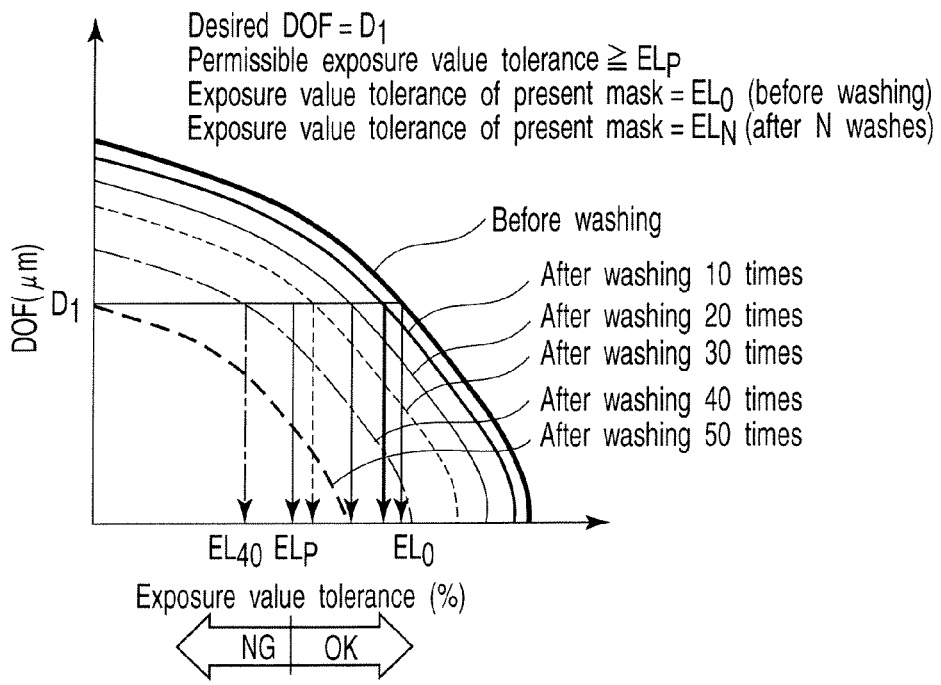
FIG. 17 is a characteristic diagram showing the lithography tolerance for each number of washes.

In the above explanation, the wash limit is derived by use of the permissible exposure value tolerance ($EL_P$) but, in practice, the number of times the photomask can be further washed is derived from FIG. 17 with respect to the permissible focal depth (D1). Therefore, generally, the wash limit that satisfies both of the permissible exposure value tolerance ($EL_P$) and the permissible focal depth (D1) is derived in step S1401. The wash limit derived in step S1410 is added to a mask ID of the photomask and then stored in a wash limit database 142.

When it is determined in the defect checking step (step S1409) that the photomask is serviceable (OK), a pellicle is attached to the photomask in a pellicle attaching step (step S1411) while the wash limit is being calculated in step S1410. Then, the photomask is transferred from the mask manufacturing process to the photolithography process for device manufacturing.

In the above explanation, the wash limit is calculated (step S1410) after it is determined in the defect checking step (step S1409) that the photomask is serviceable (OK). However, since it generally takes a long time to perform the defect checking step (step S1409), step S1410 starts to be performed to calculate the wash limit at the time when the photomask is determined to be serviceable (OK) in the flexible specification determining step (step S1408).

When the photomask is transferred to the photolithography process for device manufacturing after the pellicle attaching step (step S1411), first, the exposure condition is set by use of the lithography margin management pattern to derive an adequate exposure value (step S1412). Then, exposure for a preset number of days or a preset number of exposure processes is performed by use of the adequate exposure value derived in step S1412 (step S1413).

The photomask wash limit held in the wash limit database 142 can be referred to at the time when the photomask is transferred to the photolithography process for device manufacturing. For example, when the wash limit is three times or less, it is determined that the time at which the photomask becomes unusable is approaching and a new mask manufacturing instruction is issued from the photolithography process for device manufacturing to the mask manufacturing process.

That is, a mask pattern is drawn on a new photomask in step S1401. However, the wash limit is set to three times or less only as an example, but the wash limit can be set to any other number by taking time required for formation of a photomask into consideration if the device manufacturing process using the photomask is not delayed. Since the flow of the process is made for a new photomask, it is not shown in FIG. 14.

After step S1413, a defect checking step (mask contamination confirmation step) (step S1414) is performed. If the checking result indicates a serviceable product (OK), exposure for a preset number of days or a preset number of exposure processes is performed again by use of the adequate exposure value derived in step S1412 (step S1413) and then the defect checking step (step S1414) is performed.

The above routine is repeated until the result of the defect checking step (step S1414) becomes NG (detection of foreign matter). If the checking result becomes NG (detection of foreign matter), the photomask wash limit stored in the wash limit database 142 is referred to (step S1415).

At this time, if the photomask wash limit stored in the wash limit database 142 is "0", the photomask is not transferred to the mask manufacturing step and is determined to be unusable again and discarded (step S1416). Thus, since it is not necessary to transfer a photomask which cannot be reused even if it is washed to the mask manufacturing process, the above problem 1 can be solved.

Therefore, it is possible to omit a process from the washing step (step S1404) in the mask manufacturing process to the steps of optical measurement and dimension measurement (steps 1406 and 1407) and flexible specification determination (step S1408) performed in the case where the photomask which cannot be reused even if it is washed is transferred to the mask manufacturing process. Then, an instruction of mask drawing (step S1401) for forming a new mask can be immediately issued. As a result, time required for returning the photomask to the photolithography process for device manufacturing can be saved and the above problem 2 can be solved.

The mask drawing instruction for forming a new mask can be issued when the wash limit becomes three times or less. However, the wash limit of three times or less is set only as an example and the wash limit can be set to any other number by taking time required for forming a photomask into consideration if the device manufacturing process using the photomask is not delayed.

If it is determined in step S1415 that the wash limit becomes one time or more, the photomask is transferred to the mask manufacturing process and a pellicle is separated (not shown). Then, the photomask is washed (step S1404) and the steps of checking (step S1405), optical measurement (step S1406), dimension measurement (step S1407) and flexible specification determination (step S1408) are performed. After this, a photomask determined to be serviceable (OK) in the checking step (step S1409) is subjected to a pellicle attaching step (step S1411) and transferred again to the photolithography process for device manufacturing. The above process is repeatedly performed.

In the present embodiment, the example in which the photomask is used is explained, but the photomask wash limit generating method of this embodiment can be applied to an EUV mask, reflection type mask and the like.

As described above, in the present embodiment, the photomask wash limit is generated by taking the transferability of the photomask to the wafer and the degree of damage of the physical characteristic caused by washing the photomask into consideration. Therefore, it is possible to attain the effect that the photomask product management can be more adequately realized, that is, preparation for systematic restoration of a mask can be made so as not to give an impact to device production when it becomes necessary to form a new mask. Thus, the production efficiency of semiconductor devices can be enhanced and the manufacturing cost thereof can be lowered.

Third Embodiment

A photomask wash limit generating method according to a third embodiment of this invention is explained below with reference to the process flow shown in FIG. 19.

In the photomask wash limit generating method of the present embodiment, the wash limit indicating how many times a photomask can be washed while it has a sufficient lithography margin is calculated based on lithography tolerance derived by use of a borderline pattern after the photomask washing step in the mask manufacturing process.

Figure 19:
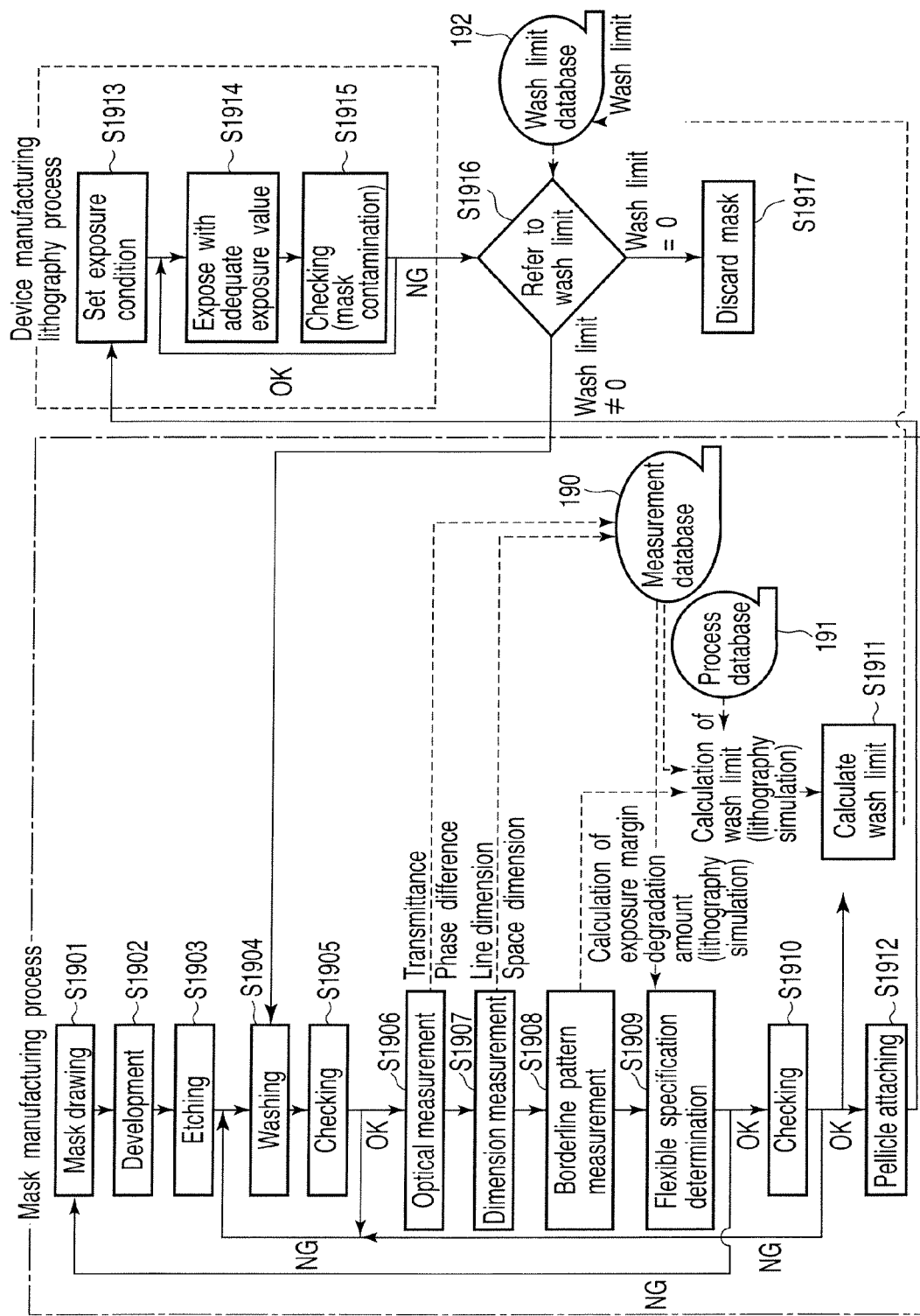
FIG. 19 is a flowchart showing a process flow of a photomask wash limit generating method according to a third embodiment of this invention.

First, like the case of the second embodiment, as shown in FIG. 19, a desired mask pattern is drawn in the mask manufacturing process (step S1901). Then, a development step (step S1902) and etching step (step S1903) are performed to form a photomask pattern. The photomask formed in this case is a halftone phase shift mask.

After this, the photomask is washed (step S1904) and then a defect checking step with desired checking sensitivity is performed (step S1905). If it is determined by the defect checking step that foreign matter is attached (NG), the checking step is performed again (step S1905) after the washing step is performed (step S1904) and the above routine is repeated until it is determined that the foreign matter is eliminated (OK).

When it is determined that the foreign matter is eliminated (OK), the transmittance and phase difference of a halftone film of a desired portion are measured in an optical measurement step (step S1906). The measurement result is stored in a measurement database 190. Then, the dimension of a space or line of a representative pattern is measured to confirm a finished state of the photomask in a dimension measurement step (step S1907). The dimension may be measured based on an image acquired by use of a scanning electron microscope (SEM) or may be measured by use of an optical measurement device. The measurement result is also stored in the measurement database 190.

The physical amount such as the sidewall shape of the pattern or the height of the pattern can be measured in step S1907. The height of the photomask pattern can be derived based on the phase difference measured in step S1906 or measured by use of an atomic force microscope (AFM). Further, information relating to the 3-dimensional structure indicating whether the sidewall shape is a tapered shape or reversely tapered shape and the degree of the tilt of the sidewall is acquired by use of a reflection light beam of an EB, atomic force microscope (AFM) or the like.

Further, at least one physical amount or a plurality of physical amounts among the physical amounts such as the transmittance and phase difference of the photomask, the dimension of the pattern, the height of the pattern and the sidewall shape of the pattern may be measured without separately providing steps S1906 and S1907 as shown in the flowchart of FIG. 19.

After this, in the present embodiment, a two-dimensional shape of a preset borderline pattern on the photomask is measured like the case of the first embodiment (step S1908). Specifically, a scanning electron microscope (SEM) image of the preset borderline pattern is acquired from the patterns on the photomask and the contour of the borderline pattern or two-dimensional information is extracted from the acquired image data.

For example, the borderline pattern is obtained by previously extracting a pattern having relatively small lithography tolerance or a pattern having the smallest lithography tolerance among all of the patterns on the photomask by a lithography simulation based on mask pattern data. In the lithography simulation, information containing the ideal exposure condition of the photolithography process and the characteristic of the exposure device relating to deviation from the ideal condition, for example, actual measurement data items of lens aberration, illumination luminance irregularity and polarization of light can be used.

Alternatively, a pattern which is known as a pattern having small lithography tolerance at the first stage is previously determined as a management pattern and may be used as a borderline pattern.

Then, physical amounts (measurement data items) measured in steps S1906 and S1907 are transferred from the measurement database 190 into a flexible specification determining system (not shown) which performs a flexible specification determining step (S1909).

The flexible specification determining system performs a lithography simulation for actually measured two-dimensional data of a borderline pattern obtained in step S1908 based on the transferred measurement data items to derive a transfer pattern of the borderline pattern on the wafer. At this time, it is assumed that the physical amounts which are not measured in steps S1906 and S1907 are not varied in the washing step and the lithography simulation may be performed by use of the standard values at the photomask shipping time.

In the lithography simulation, specifically, the dimension or shape to which the transfer pattern of the borderline pattern on the wafer is set when the exposure condition is changed due to the characteristic of the exposure device and the other causes is derived. Further, the deviation of the dimension or shape derived at this time with respect to a desired pattern, that is, dimensional tolerance is measured or the extent of coincidence in shape with the desired pattern is derived. Thus, the present lithography tolerance of the photomask can be derived.

That is, in the present embodiment, for example, lithography tolerance in a portion having the smallest lithography tolerance in the pattern transferred to the wafer is derived.

In the flexible specification determining step (step S1909), whether the photomask is usable or not is determined by use of permissible lithography tolerance previously defined in the same portion of the borderline pattern as that for the derived lithography tolerance.

If the determination result indicates a defective photomask (NG), the mask manufacturing process is started again from the mask drawing step (step S1901). In the case of a serviceable photomask (OK), a defect checking step is performed (step S1910). If it is detected in the checking step that foreign matter is attached (NG), the defect checking step (step S1905) is performed again after the washing step (step S1904) is performed. Then, the optical measurement step (step S1906), dimension measurement step (step S1907), borderline pattern measurement step (step S1908) and flexible specification determining step (step S1909) are performed and the above routine is repeated until it is determined in the defect checking step (step S1910) that the photomask is serviceable (OK).

When the photomask is determined to be serviceable (OK) in the defect checking step (step S1910), measurement data items of the newest transmittance, phase difference and dimension data stored for the photomask are transferred from the measurement database 190 to a wash limit generating system (not shown). Further, data items of the transmittance and phase difference stored in a process database 191 and varying depending on the number of washes are transferred to the wash limit generating system.

Examples of data items of the transmittance and phase difference stored in the process database 191 and varying depending on the number of washes are data items as shown in FIGS. 15 and 16 and are previously derived for the respective manufacturing processes when halftone phase shift masks manufactured by different manufacturing processes are provided.

The wash limit generating system derives exposure (lithography) tolerance under a desired optical condition for each number of washes after this based on the transferred data. At this time, two-dimensional information of a borderline pattern on the photomask obtained in step S1908 may be used.

Like the case of the second embodiment, the wash limit indicating how many times a photomask can be further washed by using preset permissible exposure value tolerance ($EL_P$) and the present exposure value tolerance already derived in the flexible specification determining system based on the relationship between the number of washes and the exposure value tolerance as shown in FIGS. 17 and 18 (step S1911).

When photomasks manufactured by different manufacturing processes are present, the exposure value tolerance derived for each number of washes is derived for each manufacturing process.

In the above explanation, the wash limit is derived by use of the permissible exposure value tolerance ($EL_P$) but, in practice, the number of times the photomask can be further washed is derived with respect to the permissible focal depth (D1) as shown in FIG. 17. Therefore, generally, the wash limit which satisfies both of the permissible exposure value tolerance ($EL_P$) and the permissible focal depth (D1) is derived in step S1911. The wash limit derived in step S1911 is added to a mask ID of the photomask and then stored in a wash limit database 192.

The flow of the following steps is basically the same as that of the second embodiment except that a borderline pattern measurement step (step S1908) is provided between the dimension measurement step (step S1907) and the flexible specification determining step (step S1909).

Also, in the present embodiment, like the second embodiment, since it is not necessary to transfer a photomask which cannot be reused even if it is washed to the mask manufacturing process and time required for returning the photomask to the photolithography process for device manufacturing can be saved, the problem described in the second embodiment can be solved.

Further, in the present embodiment, in the flexible specification determining step (step S1909) and wash limit calculating step (step S1911), whether the mask can be used or not is determined and the wash limit is calculated by use of the lithography tolerance based on information of the two-dimensional shape of the borderline pattern obtained in step S1908 on the photomask.

Therefore, the determination and calculation steps can be more precisely performed in comparison with the case of the second embodiment. As a result, the production efficiency of semiconductor devices can be enhanced and the cost thereof can be lowered.

Also, in the present embodiment, the example in which the photomask is used is explained, but the photomask wash limit generating method of this embodiment can be applied to an EUV mask, reflection type mask and the like.

Further, in the present embodiment, for example, a case wherein a pattern having the smallest lithography tolerance, that is, a pattern in which a lithography deterioration amount becomes the largest when the pattern is actually exposed is selected as a borderline pattern is explained. However, it is considered to select a borderline pattern by use of a different reference.

For example, a pattern which gives the largest influence to the device yield when a semiconductor device is actually manufactured can be selected as a borderline pattern. That is, lithography tolerance is derived in a portion in which the largest influence is given to the device yield.

The permissible lithography tolerance is previously defined in a portion in which the largest influence is given to the device yield. Thus, since the precision in the determination and calculation steps in the flexible specification determining step and wash limit calculation step is enhanced so as to enhance the yield of semiconductor devices, the effect of enhancement in the production efficiency of semiconductor devices and a lowering in the cost can be directly attained.

Fourth Embodiment

A photomask management system according to a fourth embodiment of this invention is explained below with reference to the process flow shown in FIG. 20.

In the photomask management system of the present embodiment, whether or not it is necessary to form a new mask is determined by use of the wash limit obtained by the photomask wash limit generating method according to the second and third embodiments. If it is determined necessary, timing at which a mask is systematically restored is determined so as not to give an impact to the device production to make preparations.

In this example, a photomask management system using the photomask wash limit generating method explained in the second embodiment is explained.

Figure 20:
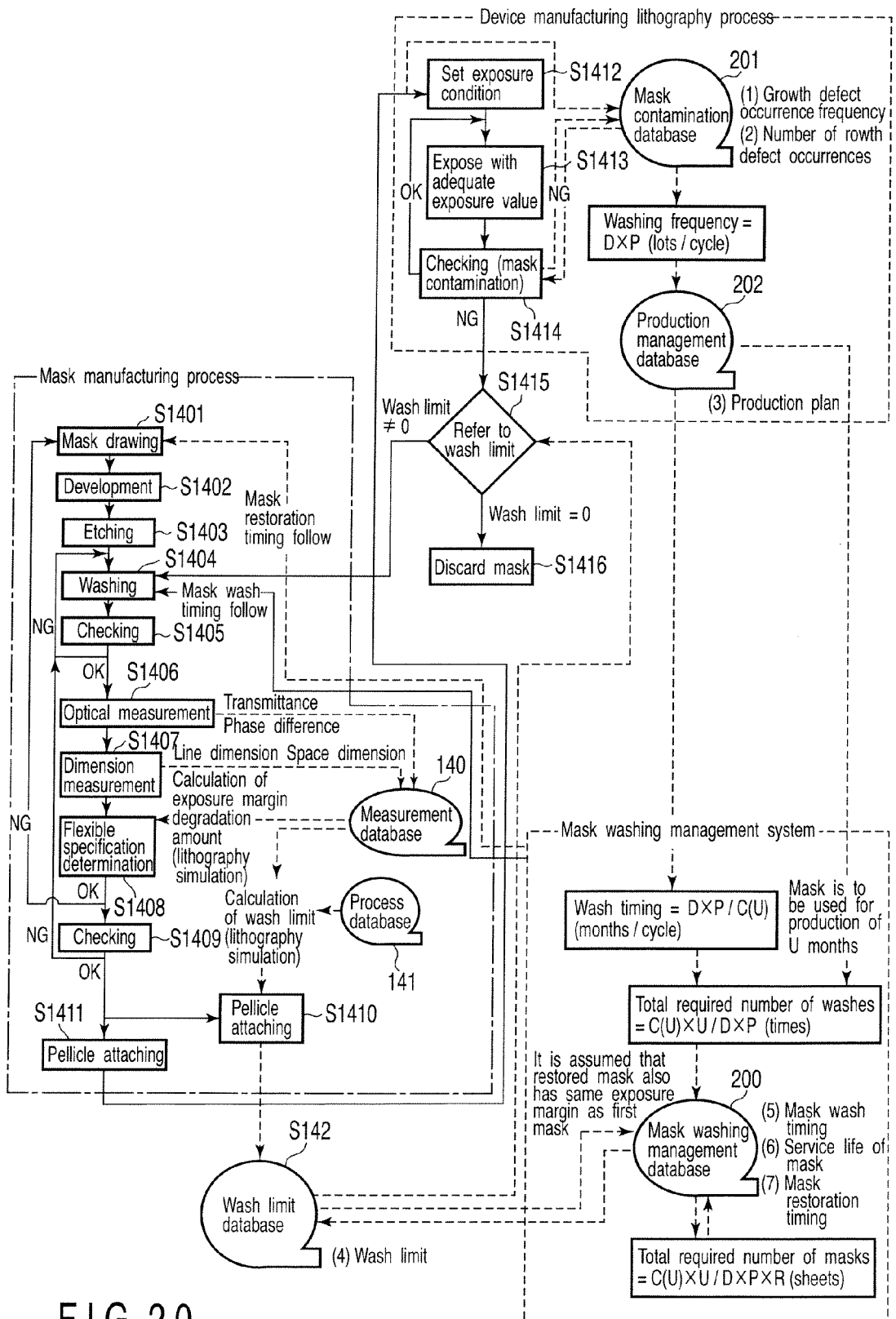
FIG. 20 is a flowchart showing a process flow of a photomask management method according to a fourth embodiment of this invention.

For example, like the second embodiment, when a photomask which is a halftone phase shift mask is determined to be serviceable (OK) in a defect checking step (step S1409) after a flexible specification determining step (step S1408) of FIG. 20, measurement data items of the newest transmittance, phase difference and dimensional data stored for the photomask are transferred from a measurement database 140 to a photomask wash limit generating system (not shown). Further, data items of the transmittance and phase difference stored in a process database 141 and varying depending on the number of washes are transferred to the wash limit generating system.

Then, like the second embodiment, the wash limit indicating how many times the photomask can be further washed is derived (step S1410). The wash limit data generated in step S1410 is added to a mask ID of the photomask and then stored in a wash limit database 142 in the wash limit generating system. The wash limit data stored in the wash limit database 142 contains information as shown in FIG. 18, for example.

The databases used below in the present embodiment containing the wash limit database 142 are each configured by a storage device such as a memory and hard disk, for example. Further, the databases are connected to a single computer or a plurality of computers (or CPUs) (not shown) which can transfer data with respect to the databases and make calculations for data stored in the databases as will be described below.

When the photomask is determined to be serviceable (OK) in the defect checking step (step S1409), a pellicle is attached to the photomask in a pellicle attaching step (step S1411) while the wash limit is being calculated in step S1410. Then, the photomask is transferred from the mask manufacturing process to the photolithography process for device manufacturing.

In the above explanation, the wash limit is generated (step S1410) after the photomask is determined to be serviceable (OK) in the defect checking step (step S1409). However, the photomask may be subjected to step S1410 to calculate the wash limit when the photomask is determined to be serviceable (OK) in the flexible specification determining step (step S1408).

Wash limit data to which a mask ID is attached and which is stored in the wash limit database 142 is further transferred to and stored in a mask washing management database 200 on a mask washing management system shown in FIG. 20 at the same time that the photomask is transferred from the mask manufacturing process to the photolithography process for device manufacturing.

Figure 21:
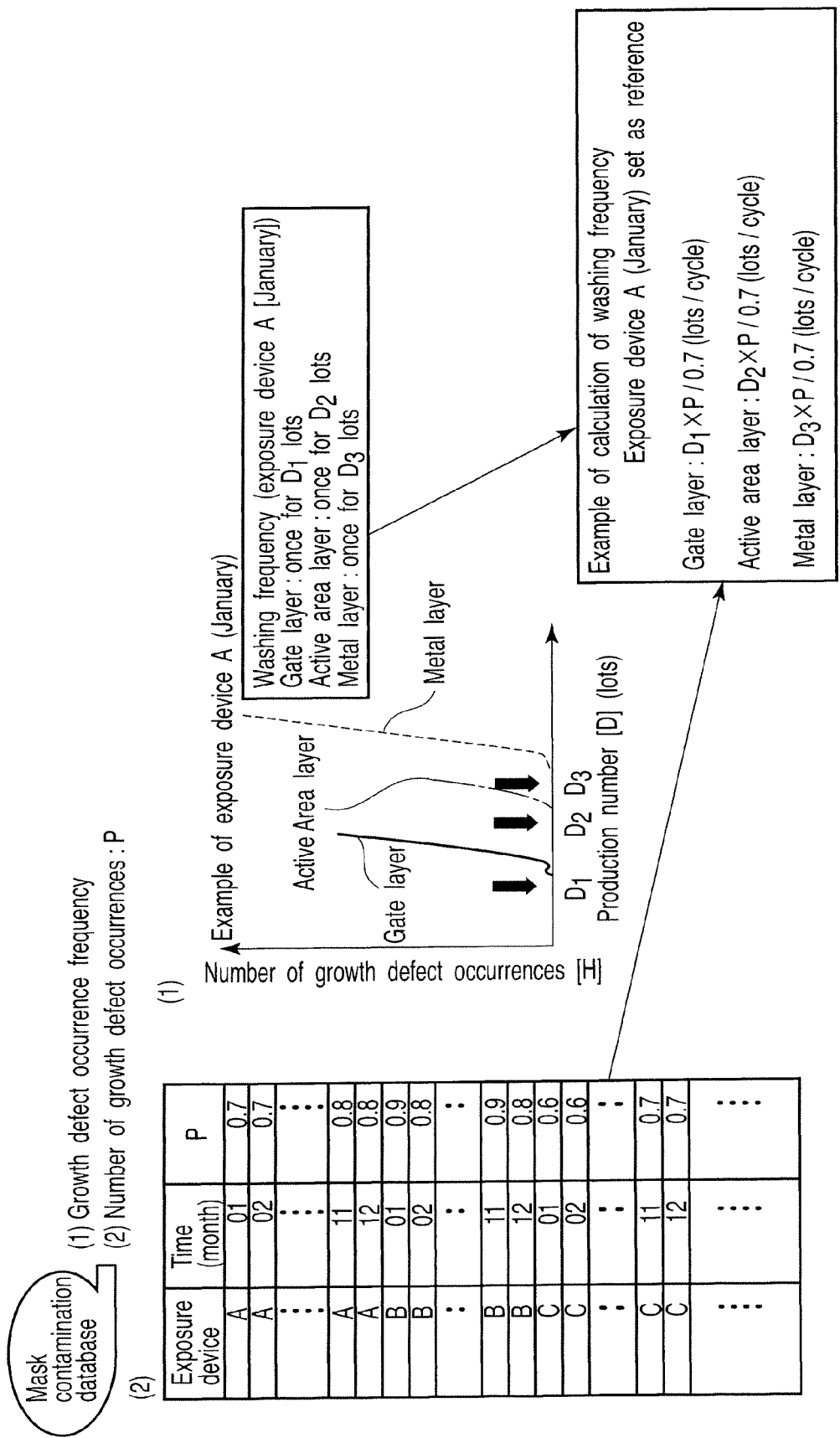
FIG. 21 is a diagram showing a growth defect occurring frequency and the number of growth defect occurrences held in a mask contamination database.

On the other hand, in the photolithography process for device manufacturing, (1) the growth defect occurrence frequency (D) and (2) the number (P) of growth defect occurrences derived based on the growth defect occurrence history of the mask obtained so far as shown in FIG. 21 are previously prepared in a mask contamination database 201.

The growth defect occurrence frequency is defined by the number of products (number of lots) in which the growth defect starts to occur, that is, D [lots] indicating the number of exposures and, as shown in graph 1 of FIG. 21, data is acquired at a specified time (month) by use of a specified exposure device. In an example shown in graph 1 of FIG. 21, $D_1$, $D_2$, $D_3$ [lots] are derived for respective photomasks corresponding to respective layers of a Gate layer, Active layer and Metal layer on January by use of an exposure device A. The number (P) of growth defect occurrences is a parameter indicating the rate of occurrence of growth defects and data is previously acquired for each exposure device and for each time (month) as shown in table 2 of FIG. 21.

Figure 22:
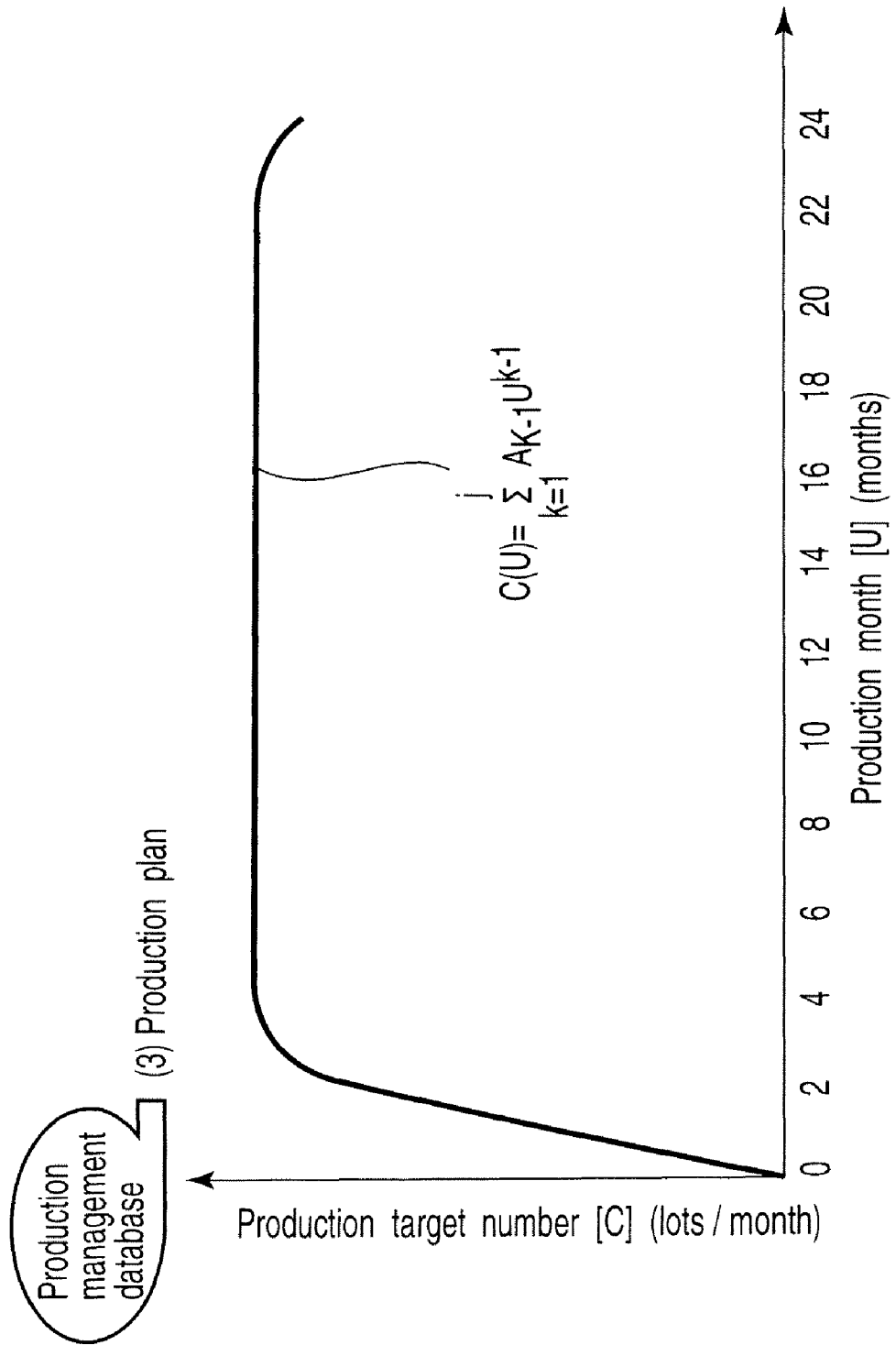
FIG. 22 is a diagram showing a production plan held in a production management database.

Further, as shown in FIG. 22, a production plan of devices formed by use of the mask before drawing the mask is previously prepared in a production management database 202. The production plan indicates a production target number C [lots/month] for each production month U.

As shown in FIG. 20, after the pellicle attaching step (step S1411), the photomask is transferred to the photolithography process for device manufacturing and then the photomask washing frequency is first generated from the mask contamination database 201.

Specifically, as shown in a washing frequency calculation example of FIG. 21, the washing frequency for each exposure device and for each month is calculated for a photomask corresponding to each layer by normalizing the washing frequency with the number of growth defect occurrences (0.7) in January by use of the exposure device A by using each of the growth defect occurrence frequencies $D_1$, $D_2$, $D_3$ [lots] acquired in January by use of the exposure device A.

In the washing frequency calculation, since an attempt is made to wash the photomask before a defect actually occurs, values smaller than the actual product number (lot number) at which the growth defect starts to occur may be used as the values of the growth defect occurrence frequencies $D_1$, $D_2$, $D_3$ [lots] by taking a certain margin.

For example, when a photomask corresponding to the Gate layer is exposed in January by use of an exposure device B, the washing frequency can be set by use of the growth defect occurrence frequency which can be estimated by substituting the value obtained in January by use of the exposure device B in table 2 of FIG. 21 into P in the following expression (1).

$$D_1 \times P/0.7 [\text{lots/cycle}] \tag{1}$$

In this case, the reason why 0.7 is used for division is to normalize data of the growth defect occurrence frequency $D_1$ by using the number of growth defect occurrences obtained in January by use of the exposure device A. However, in FIG. 20 and in the following explanation, it is assumed that P indicates a value after normalization for simplifying the explanation. The unit [lots/cycle] of the washing frequency indicates the number of lots exposed for each washing cycle.

Then, the photomask wash timing [months/cycle] expressed by the following equation (2) is derived based on the photomask washing frequency [lots/cycle] generated based on data of the mask contamination database 201 and the production number C [lots/month] for each month shown in FIG. 22 and stored in the production management database 202, that is, the exposure frequency by use of the photomask. In other words, the number of months for each of which one washing process must be performed is derived by dividing the washing frequency by the production number C [lots/month] for each month.

$$\text{Wash timing} = D \times P/C [\text{months/cycle}] \tag{2}$$

The photomask wash timing derived at this time is stored in the mask washing management database 200 in the mask washing management system shown in FIG. 20.

Further, the total required number of photomask washes required up to the device production period U [months] is derived as indicated by the following equation (3) by dividing the device production period U [months] in which the mask is used and which is stored in the production management database 202 as shown in FIG. 22 by the wash timing derived as described above.

$$\text{Total required number of washes} = C \times U/D \times P [\text{times}] \tag{3}$$

The total required number of washes derived at this time is also stored in the mask washing management database 200.

Figure 23:
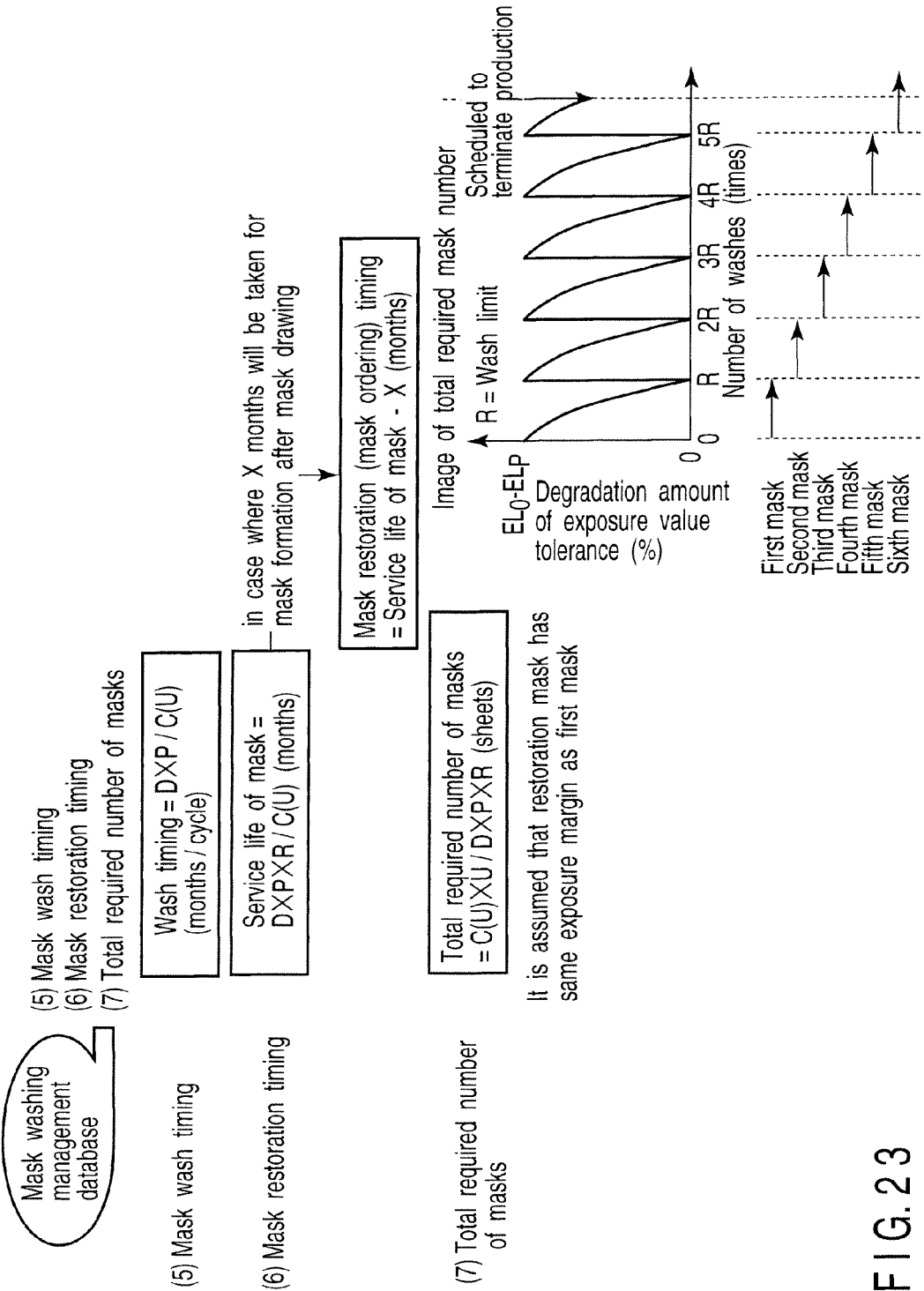
FIG. 23 is a diagram showing mask wash timing, mask service life, mask restoration timing and a derivation method thereof held in a mask washing management database.

Next, as shown in FIG. 23, the total required number of masks indicating the number of masks required in total for each photomask used to expose each layer is derived by use of the following equation (4) based on the total required number of washes stored in the mask washing management database 200 and the wash limit R [times] already transferred from the wash limit database 142 and stored in the mask washing management database 200.

$$\text{Total required number of masks} = C \times U/D \times P \times R \tag{4}$$

Since the total required number of masks is data required to make an adequate production plan, the wash limit obtained at the time when the photomask is first transferred from the mask manufacturing process to the photolithography process for device manufacturing is used as the photomask wash limit R [times] used in equation 4 to derive the total required number of masks. That is, R indicates the wash limit before the exposure process is performed in the photolithography process for device manufacturing by using the photomask.

It is supposed that a mask which is restored after a photomask is discarded first has the same exposure margin as the discarded mask based on the assumption that the total required number of masks is derived according to equation 4. That is, it is supposed that the wash limit R generated in step S1410 is set to the same value for the restored mask.

However, in this case, since R is obtained each time a photomask is formed in the mask manufacturing process and first transferred to the photolithography process for device manufacturing, the maximum value of the total required number of masks may be estimated by use of the worst-case value (minimum value) obtained up to now.

Thus, the total required number of masks is derived and, at the same time, a mask service life is derived as indicated by the following equation (5) based on the wash limit R [times] and the wash timing derived in equation 2.

$$\text{Mask service life} = D \times P \times R/C [\text{months}] \tag{5}$$

Since the reason why the mask service life is derived is to determine timing at which a mask is systematically restored, it is not always necessary to set the wash limit R used in equation 5 to the wash limit set when the photomask used in equation 4 is first transferred from the mask manufacturing process to the photolithography process for device manufacturing.

That is, as will be described later, the mask is returned again to the mask manufacturing process after the exposure process is performed several times by using the photomask in the photolithography process for device manufacturing. Then, the washing step (step S1404), checking step (step S1405), optical measurement step (step S1406), dimension measurement step (step S1407), flexible specification determining step (step S1408) and checking step (step S1409) are performed and the wash limit derived in step S1410 can be used. As a result, a reduction in the mask service life by washing can be monitored.

Each time the photomask is transferred to the photolithography process for device manufacturing, the wash limit is transferred from the wash limit database 142 to the mask washing management database 200, and therefore, the mask service life can be monitored.

In this case, in a case where it takes X months to draw a mask for mask formation, it becomes impossible to produce devices by use of a mask without intermission if a mask is not ordered X months before the mask service life will be terminated. Therefore, the mask restoration (mask ordering) timing is derived by use of the mask service life obtained as described above according to the following equation (6).

$$\text{Mask restoration (mask ordering) timing} = \text{mask service life} - X[\text{months}] \quad (6)$$

A mask ordering instruction is issued from the mask washing management system to the mask manufacturing process according to the thus derived mask restoration timing. That is, in FIG. 20, one photomask is formed in the mask manufacturing process, used in the photolithography process for device manufacturing, washed again in the mask manufacturing process and used again in the photolithography process for device manufacturing and the above process flow is repeatedly performed. While the process flow is repeatedly performed, the photomask wash limit is monotonously decreased and the mask service life shown in equation 5 is gradually shortened. Then, when the mask service life becomes X months according to equation 6 or when it becomes slightly longer than X months by taking a certain margin into consideration, that is, when it is determined that the result of equation 6 approaches zero by performing a threshold value determining process, a mask reorder is issued.

If a mask reordering instruction is issued, a mask drawing step (step S1401) for a next mask is started. Therefore, when the mask now used cannot be washed and is discarded (step S1415), a next mask can be immediately used without delay, the device production efficiency can be enhanced and the production cost can be lowered.

The total required number of masks and the mask restoration timing derived as described above are stored in the mask washing management database 200.

On the other hand, the photomask is subjected to the pellicle attaching step (step S1411) and then transferred to the photolithography process for device manufacturing. Then, an exposure condition is first set by use of a lithography margin management pattern and an adequate exposure value is derived (step S1412). Next, exposure for a preset number of days or a preset number of exposure processes is performed by use of the adequate exposure value derived in step S1412 (step S1413).

After step S1413, a defect checking step (mask contamination confirmation step) (step S1414) is performed. If the checking result indicates a serviceable product (OK), exposure for a preset number of days or a preset number of exposure processes is performed again by use of the adequate exposure value derived in step S1412 (step S1413) and then the defect checking step (step S1414) is performed.

The above routine is repeatedly performed until the result of the defect checking step (step S1414) becomes NG (detection of foreign matter). When it becomes NG (detection of foreign matter), the photomask wash limit stored in the wash limit database 142 is referred to (step S1415).

At this time, if the photomask wash limit stored in the wash limit database 142 is zero times, the photomask is not transferred to the mask manufacturing step and is determined not to be reusable and discarded (step S1416).

If it is determined in step S1415 that the wash limit is set to one time or more, the photomask is transferred to the mask manufacturing step and a pellicle is separated (not shown). Then, the photomask is subjected to the washing step (step S1404), checking step (step S1405), optical measurement step (step S1406), dimension measurement step (step S1407) and flexible specification determining step (step S1408). After this, the photomask determined as a serviceable product (OK) in the checking step (step S1409) is subjected to the wash limit calculation step (step S1410) and pellicle attaching step (step S1411) and transferred again to the photolithography process for device manufacturing.

Then, in the mask washing management system, the mask washing management database is updated by generating mask wash timing and mask restoration timing and the above process is repeatedly performed.

In the present embodiment, foreign matter is detected on the photomask after exposure as described above (step S1414) and the photomask is washed (step S1404) after step S1415. Additionally, in the mask washing management system, the washing step (step S1404) is performed based on the mask wash timing derived according to equation 2.

If foreign matter is detected on the photomask after exposure, the lots exposed from the time when the checking result indicates a serviceable product (OK) in the preceding step S1414 to the present time must be discarded. However, in the present embodiment, since the wash timing is determined based on the growth defect occurrence frequency and the number of growth defect occurrences previously acquired and stored in the mask contamination database 201, the photomask can be washed to take precautions before a defect occurs on the photomask. As a result, the manufacturing yield can be enhanced and the device manufacturing cost can be lowered.

In the explanation of the present embodiment, a case wherein the mask management system using the photomask wash limit generating method explained in the second embodiment is taken as an example is explained. However, it is also possible to use the photomask wash limit generating method explained in the third embodiment.

That is, the two-dimensional shape of a preset borderline pattern on the photomask may be previously measured before the flexible specification determining step (step S1408) and then the flexible specification determining step (step S1408) and the wash limit calculation step (step S1410) may be performed based on the above measurement result.

As a result, the determining and calculating steps can be more precisely performed in comparison with the steps using the photomask wash limit generating method explained in the second embodiment. By enhancing the precision for calculation of the wash limit, since estimation of the mask service life, that is, generation of the mask restoration (mask ordering) timing can be realized with higher precision, the device production efficiency can be enhanced and the production cost can be lowered.

In the present embodiment, a case wherein the photomask is taken as an example is explained, but the photomask wash limit generating method of the present embodiment can be applied to an EUV mask, reflection type mask and the like.

As explained above, in the present embodiment, the photomask wash limit is generated by taking a damage amount of the physical characteristic caused by washing the photomask and the transferability of the photomask onto the wafer into consideration, the service life of the photomask is predicted based on the photomask wash limit and a mask restoration instruction is issued.

That is, the photomask wash limit is generated by taking into consideration a mask damage caused when the photomask product is adequately managed from the viewpoint of a device or photolithography and the service life of the mask is predicted based on the thus acquired information, a photomask defect occurrence frequency and a device production plan in the semiconductor manufacturing facility. As a result, preparations for systematically restoring a photomask can be made without lowering the device yield when it becomes necessary to form a new photomask.

The order of the respective steps in the first to fourth embodiments is not limited to the order described above if the above effect can be attained.

As described above, according to one aspect of this invention, a photomask management method capable of enhancing the yield of semiconductor devices and lowering the cost thereof and a photomask wash limit generating method capable of enhancing the production efficiency of semiconductor devices and lowering the cost thereof can be provided. Further, a photomask management system using the above methods can be provided.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A photomask management method comprising:
    washing a photomask,
    measuring at least one physical amount of transmittance and phase difference of the photomask, dimension of a pattern, height of the pattern and a sidewall shape of the pattern after the washing,
    measuring a two-dimensional shape of a borderline pattern previously determined for the photomask after the washing,
    deriving lithography tolerance by performing a lithography simulation for the measured two-dimensional shape by use of the measured physical amount, and
    determining whether the photomask is usable based on the derived lithography tolerance,
    wherein the lithography simulation is performed by use of information containing a characteristic of an exposure device relating to a deviation from an ideal condition and an ideal exposure condition of a lithography process, and
    the lithography simulation is performed to derive one of a shape and dimension to which a transfer pattern of a borderline pattern on a wafer is set when an exposure condition varies due to the characteristic of the exposure device and other causes.

2. The photomask management method according to claim 1, wherein the pattern dimension of the photomask is measured by use of one of an image acquired by a scanning electron microscope and an optical measurement device.

3. The photomask management method according to claim 1, wherein the pattern height of the photomask is calculated based on the measured phase difference or measured by use of an atomic force microscope.

4. The photomask management method according to claim 1, wherein the sidewall shape of the pattern of the photomask is measured by use of one of an atomic force microscope and a reflection beam of an electron beam.

5. The photomask management method according to claim 1, wherein the borderline pattern is one of a management pattern and a pattern in which lithography tolerance previously derived is set to be smallest.

6. The photomask management method according to claim 1, wherein the information contains actually measured data of lens aberration, illumination luminance irregularity and polarization of light.

7. The photomask management method according to claim 1, wherein the determining whether the photomask is usable includes measuring dimensional tolerance between a dimension of the borderline pattern on the wafer and a dimension of a desired pattern and determining whether a lithography margin is acquired by comparing the dimensional tolerance with a corresponding threshold value to determine whether the photomask is usable.

8. The photomask management method according to claim 1,
    wherein the determining whether the photomask is usable includes deriving a degree of coincidence in shape between a shape of the borderline pattern on the wafer and a shape of a desired pattern and determining whether a lithography margin is acquired by comparing the degree of coincidence in shape with a corresponding threshold value to determine whether the photomask is usable.

9. A photomask management method comprising:
    washing a photomask,
    measuring at least one physical amount of transmittance and phase difference of the photomask, dimension of a pattern, height of the pattern and a sidewall shape of the pattern after the washing,
    measuring a two-dimensional shape of a borderline pattern previously determined for the photomask after the washing,
    deriving lithography tolerance by performing a lithography simulation for the measured two-dimensional shape by use of the measured physical amount, and
    determining whether the photomask is usable based on the derived lithography tolerance,
    wherein the determining whether the photomask is usable includes deriving a degree of coincidence in shape between a shape of the borderline pattern on the wafer and a shape of a desired pattern and determining whether a lithography margin is acquired by comparing the degree of coincidence in shape with a corresponding threshold value to determine whether the photomask is usable.

10. The photomask management method according to claim 9, wherein the pattern dimension of the photomask is measured by use of one of an image acquired by a scanning electron microscope and an optical measurement device.

11. The photomask management method according to claim 9, wherein the pattern height of the photomask is calculated based on the measured phase difference or measured by use of an atomic force microscope.

12. The photomask management method according to claim 9, wherein the sidewall shape of the pattern of the photomask is measured by use of one of an atomic force microscope and a reflection beam of an electron beam.

13. The photomask management method according to claim 9, wherein the borderline pattern is one of a management pattern and a pattern in which lithography tolerance previously derived is set to be smallest.

14. The photomask management method according to claim 9, wherein the lithography simulation is performed by use of information containing a characteristic of an exposure device relating to a deviation from an ideal condition and an ideal exposure condition of a lithography process.

15. The photomask management method according to claim 14, wherein the information contains actually measured data of lens aberration, illumination luminance irregularity and polarization of light.

* * * * *